US010831017B2

(12) United States Patent
Kiuchi et al.

(10) Patent No.: US 10,831,017 B2
(45) Date of Patent: Nov. 10, 2020

(54) DISPLACEMENT INCREASING MECHANISM AND SHUTTER DEVICE

(71) Applicant: SUMITOMO PRECISION PRODUCTS CO., LTD., Hyogo (JP)

(72) Inventors: Mario Kiuchi, Hyogo (JP); Ryohei Uchino, Hyogo (JP); Tomonori Mori, Hyogo (JP)

(73) Assignee: SUMITOMO PRECISION PRODUCTS CO., LTD., Hyogo (JP)

( * ) Notice: Subject to any disclaimer, the term of this patent is extended or adjusted under 35 U.S.C. 154(b) by 324 days.

(21) Appl. No.: 16/081,912

(22) PCT Filed: Mar. 17, 2017

(86) PCT No.: PCT/JP2017/010827
§ 371 (c)(1),
(2) Date: Sep. 2, 2018

(87) PCT Pub. No.: WO2017/164094
PCT Pub. Date: Sep. 28, 2017

(65) Prior Publication Data
US 2019/0064505 A1 Feb. 28, 2019

(30) Foreign Application Priority Data
Mar. 23, 2016 (JP) ................. 2016-057984

(51) Int. Cl.
*G02B 26/02* (2006.01)
*G03B 9/10* (2006.01)
(Continued)

(52) U.S. Cl.
CPC .......... *G02B 26/023* (2013.01); *B81B 3/0037* (2013.01); *B81B 3/0043* (2013.01);
(Continued)

(58) Field of Classification Search
CPC .... G02B 26/023; G02B 26/02; B81B 3/0072; B81B 3/0043; B81B 3/0037;
(Continued)

(56) References Cited

U.S. PATENT DOCUMENTS 9,256,065 B1 2/2016 Jin
2003/0101721 A1 6/2003 Janssen
(Continued)

FOREIGN PATENT DOCUMENTS

WO 2015/153179 A1 10/2015

OTHER PUBLICATIONS

International Search Report for corresponding App. No. PCT/JP2017/010827, dated Apr. 18, 2017.

*Primary Examiner* — Euncha P Cherry
(74) *Attorney, Agent, or Firm* — Renner, Otto, Boisselle & Sklar, LLP

(57) ABSTRACT

A displacement increasing mechanism has a fixing portion, first and second actuators coupled to the fixing portion, a first beam having first and second end portions and coupled to the first actuator at the first end portion, a second beam having third and fourth end portions and coupled to the second actuator at the third end portion, and a drive target member coupled to a parallel arrangement portion at which the first and second beams are arranged in parallel with each other. The first actuator is driven to pull the first beam from a second end portion side in the direction of extending the first beam, and the second actuator is driven to push the second beam form a fourth end portion side in the direction of extending the second beam.

20 Claims, 22 Drawing Sheets

(51) Int. Cl.
  *B81B 3/00*  (2006.01)
  *G03B 9/08*  (2006.01)
(52) U.S. Cl.
  CPC .......... *B81B 3/0051* (2013.01); *B81B 3/0072* (2013.01); *G02B 26/02* (2013.01); *G03B 9/10* (2013.01); *B81B 2201/032* (2013.01); *B81B 2201/045* (2013.01); *B81B 2203/0118* (2013.01); *G03B 9/08* (2013.01)
(58) Field of Classification Search
  CPC ............ B81B 3/0051; B81B 2201/032; B81B 2201/045; B81B 2203/0118; G03B 9/10; G03B 9/08
  USPC ........................................................ 359/290
  See application file for complete search history.

(56) References Cited

U.S. PATENT DOCUMENTS

| | | |
|---|---|---|
| 2015/0277103 A1 | 10/2015 | Yin |
| 2017/0183217 A1 | 6/2017 | Yin |
| 2017/0184840 A1 | 6/2017 | Yin |
| 2018/0239127 A1* | 8/2018 | Nishiki .................. G02B 26/02 |

* cited by examiner

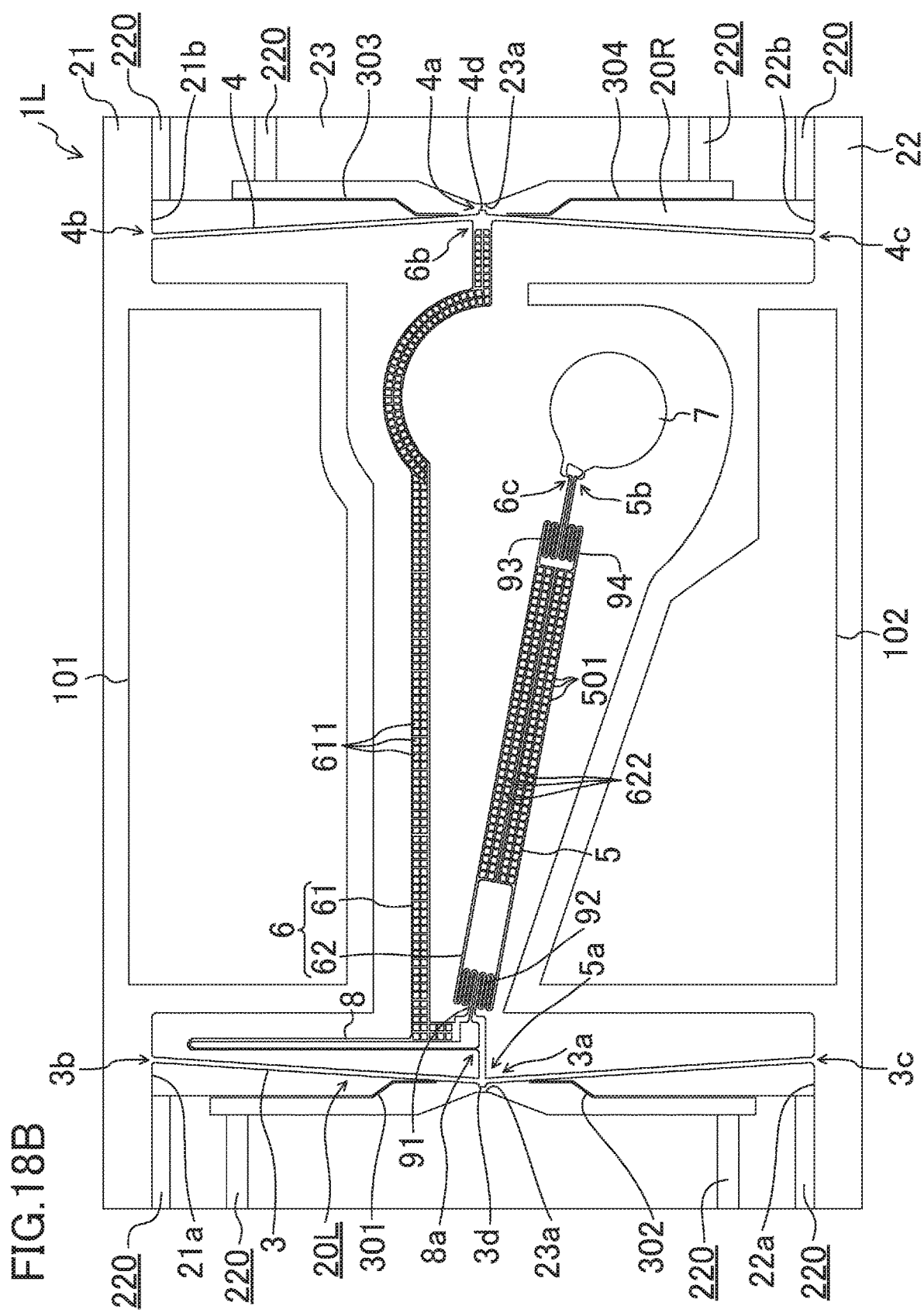

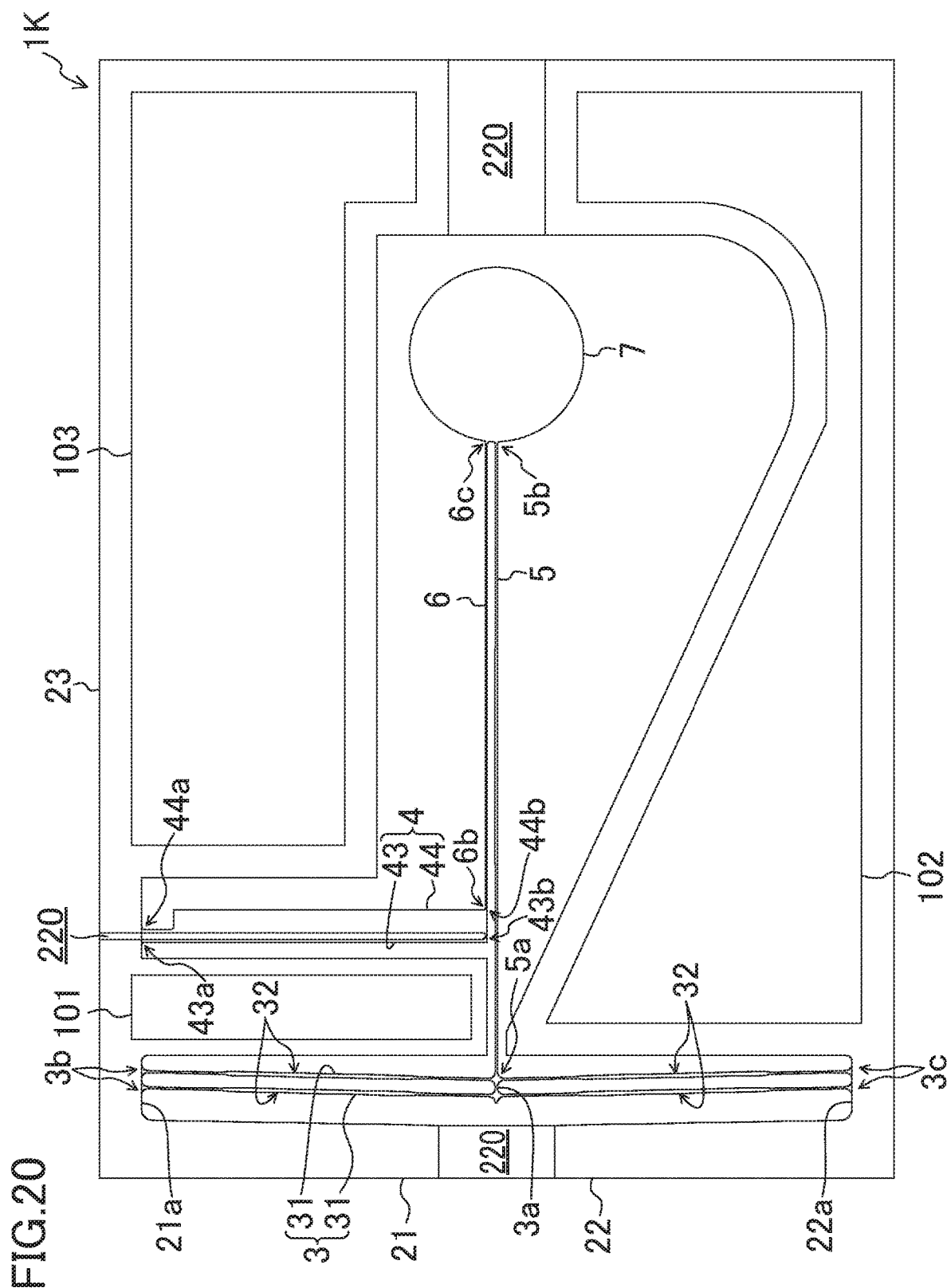

DISPLACEMENT INCREASING MECHANISM AND SHUTTER DEVICE

TECHNICAL FIELD

The technique disclosed herein relates to a displacement increasing mechanism and a shutter device.

BACKGROUND ART

Typically, a shutter device configured to close or open a predetermined light path has been known. For example, a shutter device described in Patent Document 1 (particularly see FIG. 6) includes a displacement increasing mechanism having a shutter and an actuator configured to drive the shutter. The actuator includes a beam and two side members. The beam extends from a base member. An end portion of the beam is folded back, and is coupled to the first side member. An end portion of the first side member is folded back, and is coupled to the second side member. An end portion of the second side member is fixed. The shutter is attached to a coupling portion between the first side member and the second side member. In the displacement increasing mechanism, when the beam is extended due to heating, the first side member and the second side member are curved, and the shutter is driven.

CITATION LIST

Patent Document

PATENT DOCUMENT 1: US Patent Application Publication No. 2003/0101721

SUMMARY OF THE INVENTION

Technical Problem

In the shutter device described in Patent Document 1, the end portion of the second side member is fixed, and therefore, displacement of the shutter depends on displacement of the beam coupled to the first side member. Thus, for driving the shutter with a greater amplitude, the beam needs to be greatly extended. However, there is a problem that extension of the beam is limited and the beam cannot be extended much. Moreover, when the beam is frequently extended, a load in association with deformation is accumulated on the beam, and in the worst case, the beam is damaged.

The technique disclosed herein has been made in view of such a point, and is intended to provide a displacement increasing mechanism capable of greatly displacing a drive target member by slight displacement of a drive member and a shutter device including the displacement increasing mechanism.

Solution to the Problem

The displacement increasing mechanism disclosed herein includes a fixing portion, a first actuator and a second actuator coupled to the fixing portion, a first beam having a first end portion and a second end portion and coupled to the first actuator at the first end portion, a second beam having a third end portion and a fourth end portion and coupled to the second actuator at the third end portion, and a drive target member coupled to the second end portion of the first beam and the fourth end portion of the second beam. The first beam and the second beam have a parallel arrangement portion at which the first beam and the second beam are arranged in parallel with each other, and the drive target member is coupled on a tip end side of the parallel arrangement portion. The first actuator is driven to pull the first beam from a second end portion side in the direction of extending the first beam. The second actuator is driven to push the second beam from a fourth end portion side in the direction of extending the second beam.

According to this configuration, the first actuator and the second actuator are coupled to the fixing portion, the first end portion of the first beam is coupled to the first actuator, the third end portion of the second beam is coupled to the second actuator, the drive target member is coupled to the second end portion of the first beam and the fourth end portion of the second beam, the first beam and the second beam have the parallel arrangement portion at which the first beam and the second beam are arranged in parallel with each other, and the drive target member is coupled on the tip end side of the parallel arrangement portion. The first actuator is driven to pull the first beam from the second end portion side in the direction of extending the first beam, and the second actuator is driven to push the second beam from the fourth end portion side in the direction of extending the second beam. That is, drive forces of the first beam and the second beam each driven by the first actuator and the second actuator are combined to drive the drive target member.

Moreover, the shutter device disclosed herein includes the displacement increasing mechanism, a first electrode arranged on the fixing portion of the displacement increasing mechanism and electrically connected to the first end portion of the first actuator and the first end portion of the second actuator of the displacement increasing mechanism, and a second electrode arranged on the fixing portion of the displacement increasing mechanism and electrically connected to the second end portion of the first actuator and the second end portion of the second actuator of the displacement increasing mechanism. A light path is closed or opened by the drive target member of the displacement increasing mechanism.

According to this configuration, when voltage is applied to between the first electrode and the second electrode, current flows in the first actuator and the second actuator. The first actuator and the second actuator are heated and thermally expanded to drive the first beam and the second beam. Then, the drive target member coupled to these two beams is driven.

Advantages of the Invention

According to the displacement increasing mechanism, the drive target member can be greatly displaced by slight displacement of the first actuator and the second actuator as the drive members. Moreover, according to the shutter device including the displacement increasing mechanism, the drive target member can be greatly displaced by application of low voltage to between the first electrode and the second electrode.

BRIEF DESCRIPTION OF THE DRAWINGS

FIG. 18B is a plan view upon driving of the shutter device illustrated in FIG. 18A.

FIG. 20 is a plan view of a shutter device according to another embodiment of the present invention.

DESCRIPTION OF EMBODIMENTS

Hereinafter, an exemplary embodiment will be described in detail with reference to the drawings.

Figure 1:
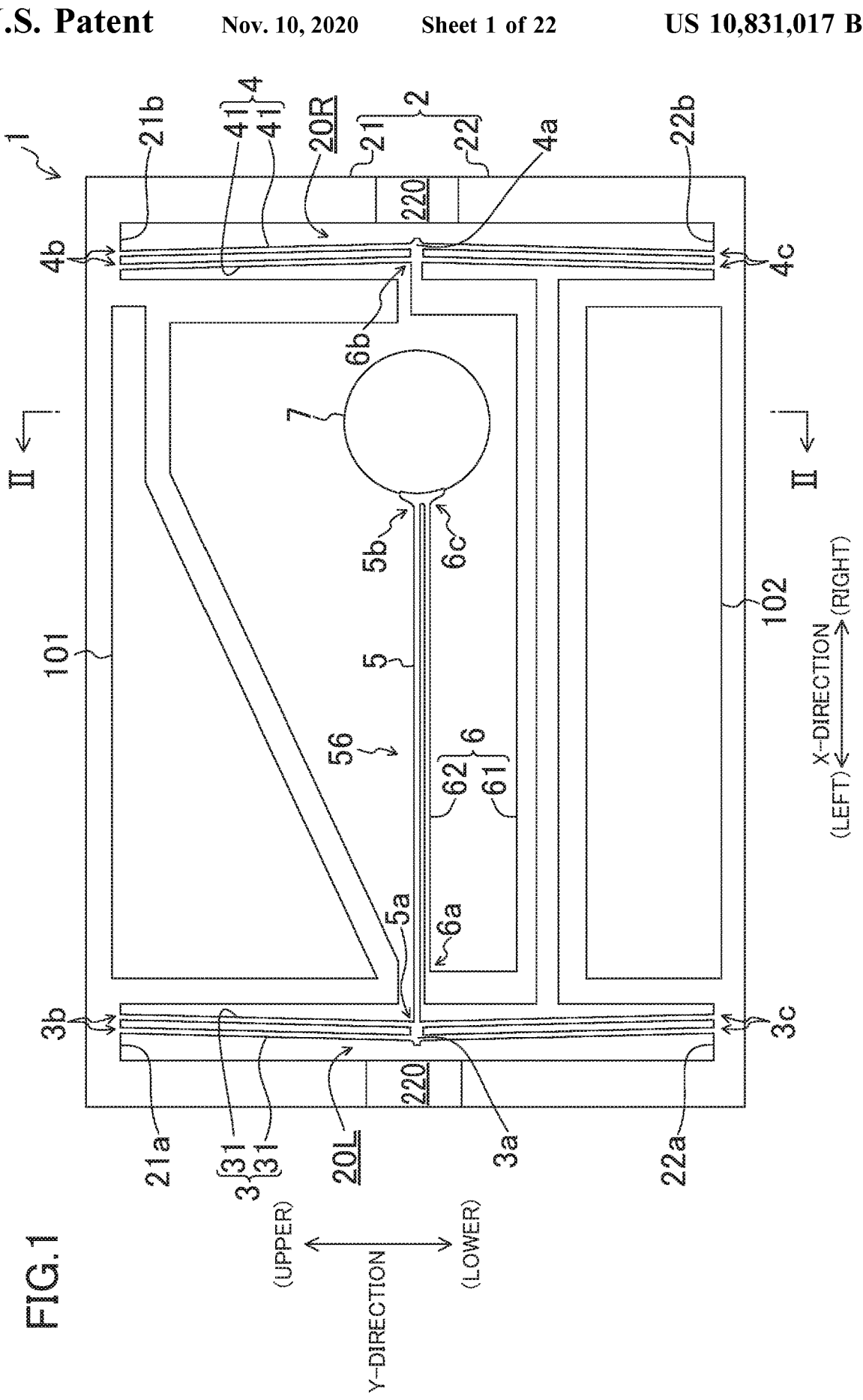
FIG. 1 is a plan view of a shutter device according to one embodiment of the present invention.
Figure 2:
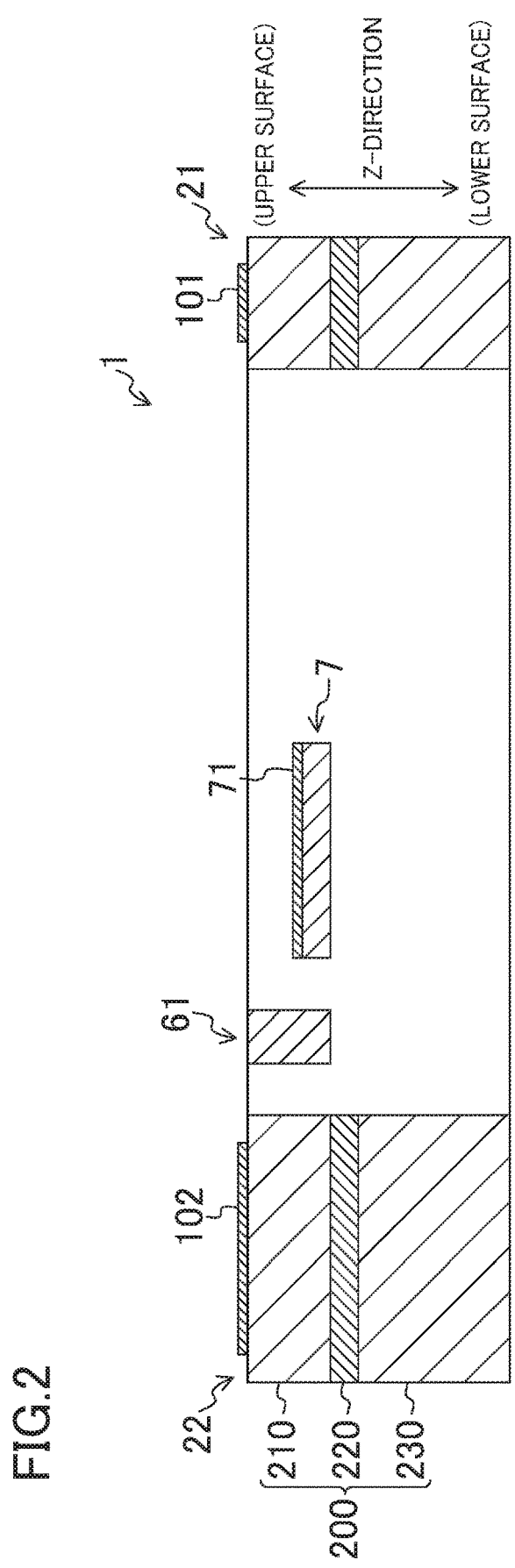
FIG. 2 is a sectional view of the shutter device along an II-II line of FIG. 1.

FIG. 1 illustrates a plan view of a shutter device 1 according to one embodiment of the present invention, and FIG. 2 illustrates a sectional view of the shutter device 1 along an II-II line of FIG. 1. Note that the inventor(s) of the present invention provides the attached drawings and the following description for the sake of sufficient understanding of the present invention by those skilled in the art, and is not intended to limit a subject matter of the description to the scope of the claims by the attached drawings and the description. Moreover, e.g., the dimensions and thickness of each member in the drawings and particular shapes of details are sometimes different from those of actual members.

[Configuration of Shutter Device]

The shutter device 1 includes a fixing portion 2, a first actuator 3 and a second actuator 4 coupled to the fixing portion 2, a first beam 5 having a first end portion 5a and a second end portion 5b coupled to the first actuator 3 at the first end portion 5a, a second beam 6 having a third end portion 6b and a fourth end portion 6c and coupled to the second actuator 4 at the third end portion 6b, a drive target member 7 coupled to the second end portion 5b of the first beam 5 and the fourth end portion 6c of the second beam 6, a first electrode 101, and a second electrode 102.

For the sake of convenience of description, a longitudinal direction of the first beam 5 will be hereinafter referred to as an "X-direction," longitudinal directions of the first actuator 3 and the second actuator 4 will be hereinafter referred to as a "Y-direction," and a thickness direction of the shutter device 1 will be hereinafter referred to as a "Z-direction." Note that in the X-direction, a left side in FIG. 1 will be sometimes merely referred to as a "left side," and a right side in FIG. 1 will be sometimes merely referred to as a "right side." In the Y-direction, an upper side in FIG. 1 will be sometime merely referred to as an "upper side," and a lower side in FIG. 1 will be sometimes merely referred to as a "lower side." In the Z-direction, an upper side in FIG. 2 will be sometimes referred to as an "upper surface," and a lower side in FIG. 2 will be sometimes referred to as a "lower surface." Moreover, the first end portion 5a of the first beam 5 or the third end portion 6b of the second beam 6 will be sometimes referred to as a "base end," and the second end portion 5b of the first beam 5 or the fourth end portion 6c of the second beam 6 will be sometimes referred to as a "tip end."

The shutter device 1 is a so-called micro electro mechanical system (MEMS) shutter, and is manufactured by a micromachining technique to which a semiconductor micromachining technique is applied. The shutter device 1 is manufactured using a silicon on insulator (SOI) substrate 200. The SOI substrate 200 is configured such that a first silicon layer 210 made of single-crystal silicon, an oxide film layer 220 made of $SiO_2$, and a second silicon layer 230 made of single-crystal silicon are stacked in this order.

As described above, in the shutter device 1, the fixing portion 2, the first actuator 3, the second actuator 4, the first beam 5, the second beam 6, and the drive target member 7 are integrally formed from a silicon material, and form a displacement increasing mechanism.

Note that the oxide film layer 220 and the second silicon layer 230 remain at lower surfaces of a first base member 21 and a second base member 22 forming the fixing portion 2, and the oxide film layer 220 and the second silicon layer 230 at lower surfaces of the first actuator 3, the second actuator 4, the first beam 5, the second beam 6, and the drive target member 7 as movable members are removed in a manufacturing process.

As illustrated in FIG. 1, the shutter device 1 has an entire rectangular shape as viewed in the plane, for example. The fixing portion 2 is a frame forming the entire rectangular shape of the shutter device 1 as viewed in the plane. The fixing portion 2 includes the first base member 21 and the second base member 22 arranged facing each other in the Y-direction. When an upper side of the shutter device 1 in the Y-direction is a first side, a lower side facing the first side in the Y-direction is a second side, a left side in the X-direction is a third side, and a right side facing the third side in the X-direction is a fourth side, the first side, part of the third side, and part of the fourth side form the first base member 21. Moreover, the second side, another part of the third side, and another part of the fourth side form the second base member 22. Any of the first base member 21 and the second base member 22 is formed in such a shape that movable areas of the first actuator 3, the second actuator 4, the first beam 5, the second beam 6, and the drive target member 7 are ensured while the first base member 21 or the second base member 22 covers a largest possible area.

Note that the fixing portion 2 is divided into two parts including the first base member 21 and the second base member 22 in the first silicon layer 210, but are connected together in the oxide film layer 220 and the second silicon layer 230. Thus, the relative positions of the first base member 21 and the second base member 22 are fixed, and the movable members can be supported at the first base member 21 and the second base member 22.

The first base member 21 has a first recessed portion 21a and a second recessed portion 21b opening toward the opposing second base member 22. The first recessed portion 21a is arranged at a left end portion of the first base member 21 in the X-direction. The second recessed portion 21b is arranged at a right end portion of the first base member 21 in the X-direction.

The second base member 22 has a third recessed portion 22a and a fourth recessed portion 22b opening toward the opposing first base member 21. The third recessed portion 22a is arranged at a left end portion of the second base member 22 in the X-direction. The fourth recessed portion 22b is arranged at a right end portion of the second base member 22 in the X-direction.

Further, the first recessed portion 21a of the first base member 21 and the third recessed portion 22a of the second base member 22 are arranged at such positions that openings thereof face each other, and for arranging the first actuator 3, form a substantially rectangular opening 20L elongated in the Y-direction. Similarly, the second recessed portion 21b of the first base member 21 and the fourth recessed portion 22b of the second base member 22 are arranged at such positions that openings thereof face each other, and for arranging the second actuator 4, form a substantially rectangular opening 20R elongated in the Y-direction. In the first base member 21 and the second base member 22, a pattern with a relatively-large area covers other portions than the openings 20L, 20R. More specifically, the opening 20L is formed along the third side of the substantially-rectangular fixing portion 2 on the left side in the X-direction, the opening 20R is formed along the fourth side, which faces the third side, of the fixing portion 2 on the right side in the X-direction, and the first actuator 3 and the second actuator 4 are each provided facing the opening 20L and the opening 20R facing each other.

As described above, the fixing portion 2 is formed in such a shape that the movable areas of the movable members are ensured while the fixing portion 2 covers a largest possible area, and therefore, high stiffness required as a frame for supporting the first actuator 3 and the second actuator 4 is ensured.

The first actuator 3 includes two actuators 31 arranged in parallel. These two actuators 31 are rod-shaped members extending in the Y-direction, and are coupled to each other at a substantially-center intermediate portion 3a between a first end portion 3b and a second end portion 3c of the first actuator 3 in the longitudinal direction. The two actuators 31 are coupled at the intermediate portion 3a as described above, and therefore, drive forces of the two actuators 31 are combined so that the first actuator 3 can provide great drive force. As will be described later, the first actuator 3 thermally expands due to heating by power distribution to generate the drive force.

The first end portions 3b of the two actuators 31 are coupled to the first base member 21 at a bottom portion of the first recessed portion 21a of the first base member 21. The second end portions 3c of the two actuators 31 are coupled to the second base member 22 at a bottom portion of the third recessed portion 22a of the second base member 22.

In a precise sense, the first actuator 3 does not extend straight in the Y-direction, but is slightly bent such that the intermediate portion 3a projects to the left side in the X-direction as a drive direction of the first actuator 3 or is slightly curved to entirely protrude to the left side in the X-direction.

The second actuator 4 includes two actuators 41 arranged in parallel. These two actuators 41 are rod-shaped members extending in the Y-direction, and are coupled to each other at a substantially-center intermediate portion 4a between a first end portion 4b and a second end portion 4c of the second actuator 4 in the longitudinal direction. The two actuators 41 are coupled at the intermediate portion 4a as described above, and therefore, drive forces of the two actuators 41 are combined so that the second actuator 4 can provide great drive force. As will be described later, the second actuator 4 thermally expands due to heating by power distribution to generate the drive force.

The first end portions 4b of the two actuators 41 are coupled to the first base member 21 at a bottom portion of the second recessed portion 21b of the first base member 21. The second end portions 4c of the two actuators 41 are coupled to the second base member 22 at a bottom portion of the fourth recessed portion 22b of the second base member 22.

In a precise sense, the second actuator 4 does not extend straight in the Y-direction, but is slightly bent such that the intermediate portion 4a projects to the right side in the X-direction as a drive direction of the second actuator 4 or is slightly curved to entirely protrude to the right side in the X-direction. As described above, each of the first actuator 3 and the second actuator 4 is bent or curved with respect to the drive direction thereof, and therefore, is not bent or curved to the opposite side of the drive direction upon thermal expansion by heating. Thus, each of the first actuator 3 and the second actuator 4 can be reliably bent or curved in the drive direction.

As described above, the first actuator 3 is arranged on the left side in the X-direction in the shutter device 1, the second actuator 4 is arranged on the right side in the X-direction in the shutter device 1, and the first actuator 3 and the second actuator 4 face each other as viewed in the plane.

The drive target member 7 is arranged between the first actuator 3 and the second actuator 4 facing each other. More specifically, the drive target member 7 is arranged at a position closer to the second actuator 4. In the shutter device 1, the drive target member 7 functions as a shutter configured to close or open a not-shown light path. Thus, the drive target member 7 is formed in a planar shape slightly larger than the section of the light path, specifically a circular shape.

The drive target member 7 is formed thinner than other members forming the displacement increasing mechanism. Thus, the mass of the drive target member 7 is decreased, and a resonance frequency is increased. Moreover, a metal film 71 such as an Au/Ti film is formed across the entire surface of the drive target member 7.

Figure 3:
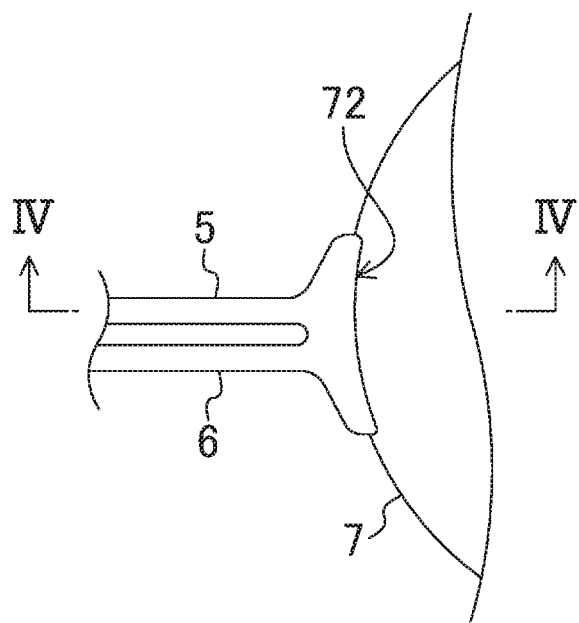
FIG. 3 is an enlarged plan view of a coupling portion between each of a first beam and a second beam and a drive target member.
Figure 4:
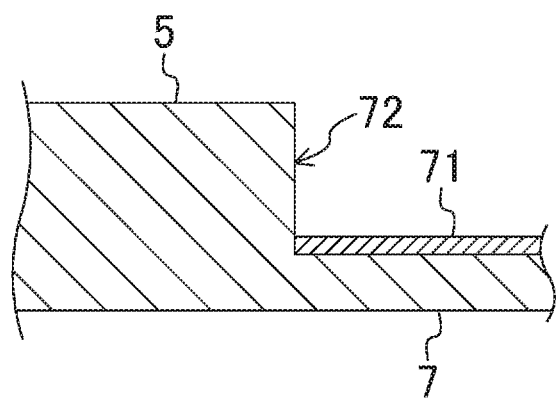
FIG. 4 is a sectional view of the shutter device along an IV-IV line of FIG. 3.

The first beam 5 and the second beam 6 are coupled to the drive target member 7. FIG. 3 illustrates an enlarged plan view of a coupling portion between each of the first beam 5 and the second beam 6 and the drive target member 7, and FIG. 4 illustrates a sectional view of the shutter device 1 along an IV-IV line of FIG. 3.

A radiation portion 72 is formed at the coupling portion between each of the first beam 5 and the second beam 6 and the drive target member 7. The radiation portion 72 is formed using a difference in a thickness between each of the first beam 5 and the second beam 6 and the drive target member 7, and has a surface standing upright from a surface of the drive target member 7, for example. Such a surface plays a role as a radiation surface for releasing heat generated at the first actuator 3 upon driving of the first actuator 3 and transmitted from the first actuator 3 by way of the first beam 5 and/or heat generated at the second actuator 4 upon driving of the second actuator 4 and transmitted from the second actuator 4 by way of the second beam 6 as described above. Thus, for ensuring a large surface area of the radiation portion 72 and enhancing stiffness of the coupling portion between each of the first beam 5 and the second beam 6 and the drive target member 7, the radiation portion 72 may be formed in a shape slightly larger than the drive target member 7 along the periphery of the drive target member 7. In some cases, a metal film such as a gold film is, as a blocking film configured to block light from a not-shown light source, formed on the surface of the drive target member 7. With the above-described radiation portion 72, diffusion of silicon into the metal film due to an increase in the temperature of the drive target member 7 can be prevented, and a change in optical properties such as unavailability of blocking of light can be prevented. Note that a region where the thickness of the drive target member 7 changes in a stepwise manner from the first beam 5 and the second beam 6 may be provided as the radiation portion 72. Moreover, a spot at which the radiation portion 72 is formed may be at the first beam 5, the second beam 6, the drive target member 7, a boundary therebetween, or other members than those components. Further, the shape of the radiation portion 72 is not limited. The thickness of the drive target member 7 is less than those of the first beam 5 and the second beam 6 so that an inflow path of heat propagating from the first beam 5 or a second member 62 of the second beam can be narrowed and propagation of heat generated at the first actuator 3 and the second actuator 4 to the drive target member 7 can be reduced. Accordingly, in the drive target member 7, diffusion of silicon in the metal film 71 can be prevented, and a change in the optical properties such as unavailability of blocking of light can be prevented, for example.

Referring back to FIG. 1, the first beam 5 is a rod-shaped member extending in the X-direction. The first end portion 5a of the first beam 5 is coupled to the intermediate portion 3a of the first actuator 3. The second end portion 5b of the first beam 5 is coupled to the drive target member 7.

The second beam 6 is a member having a folded-back structure, and includes a first member 61 extending from the intermediate portion 4a of the second actuator 4 to the vicinity of the intermediate portion 3a of the first actuator 3 and the second member 62 folded back from an end portion 6a of the first member 61 to the second actuator 4. The third end portion 6b (i.e., a tip end close to the first member 61) of the second beam 6 is coupled to the intermediate portion 4a of the second actuator 4. The fourth end portion 6c (i.e., a tip end close to the second member 62) of the second beam 6 is coupled to the drive target member 7.

The second member 62 is a rod-shaped member extending from the end portion 6a of the first member 61 in the X-direction and having the substantially same width as that of the first beam 5. The second member 62 is arranged in parallel with the first beam 5 on a side slightly lower than the first beam 5 in the Y-direction. Note that the phrasing of "arranging the first beam 5 and the second member 62 of the second beam in parallel" indicates, including description below, that the first beam 5 and the second member 62 of the second beam are arranged in a substantially parallel relationship. Moreover, a portion 56 at which the first beam 5 and the second member 62 of the second beam 6 are arranged in parallel with each other will be sometimes referred to as a "parallel arrangement portion 56." That is, the first beam 5 and the second member 62 of the second beam 6 in parallel with each other are coupled to the drive target member 7 from the same direction. In other words, a tip end side of the first beam 5 is folded back at the radiation portion 72, and therefore, the first beam 5 and the second member 62 of the second beam 6 are arranged in parallel at the coupling portion between each of the first beam 5 and the second beam 6 and the drive target member 7. In different words, a tip end side of the second member 62 of the second beam 6 is folded back at the radiation portion 72, and therefore, the first beam 5 and the second member 62 of the second beam 6 are arranged in parallel at the coupling portion between each of the first beam 5 and the second beam 6 and the drive target member 7. The first beam 5 pulls the drive target member 7 from the second end portion 5b in the direction of extending the first beam 5, whereas the second beam 6 pushes the drive target member 7 from the fourth end portion 6c in the direction of extending the second beam 6. In this manner, the drive target member 7 is driven. As will be described later, the first beam 5 and the second member 62 of the second beam 6 are elastically deformed by driving by the first actuator 3 and the second actuator 4, and accordingly, the drive target member 7 moves to another position on an XY plane. Note that in the opposite way to above, the first beam 5 may push the drive target member 7, whereas the second beam 6 may pull the drive target member 7.

The first member 61 is a member in, e.g., a hook shape bypassing the drive target member 7. Part of the first member 61 extends to partition part of the opening 20L where the first actuator 3 is formed and part of the opening 20R where the second actuator 4 is formed. Moreover, the first member 61 at least partially has a highly-elastic region such that an elastic modulus is higher than that of the second member 62, and is formed wide, for example. The first member 61 corresponds to a highly-elastic region described in the claims. As will be described later, even when the second beam 6 is driven by the second actuator 4, the first member 61 holds the hook shape with little elastic deformation to transmits the drive force of the second actuator 4 to the second member 62. In addition, the highly-elastic region may be configured such that part of the first member 61 is thicker than the second member 62 or a metal film is formed at part of the first member 61. Note that the second beam 6 may be directly coupled to the fixing portion 2 without the second actuator 4 of the present embodiment. Specifically, the second beam 6 may include only the second member 62, and an end portion of the second member 62 opposite to the fourth end portion 6c may be directly coupled to the fixing portion 2 (the first base member 21 or the second base member 22). In this case, the second member 62 may be directly coupled to the fixing portion 2 in a state in which the second member 62 is substantially straight or has a slight curvature, or may be coupled to the fixing portion 2 after the vicinity of the end portion of the second member 62 opposite to the fourth end portion 6c has been bent.

The first electrode 101 is a metal film formed on the upper surface of the first base member 21, such as an Au/Ti film.

The second electrode 102 is a metal film formed on the upper surface of the second base member 22, such as an Au/Ti film.

[Operation of Shutter Device]

Figure 5:
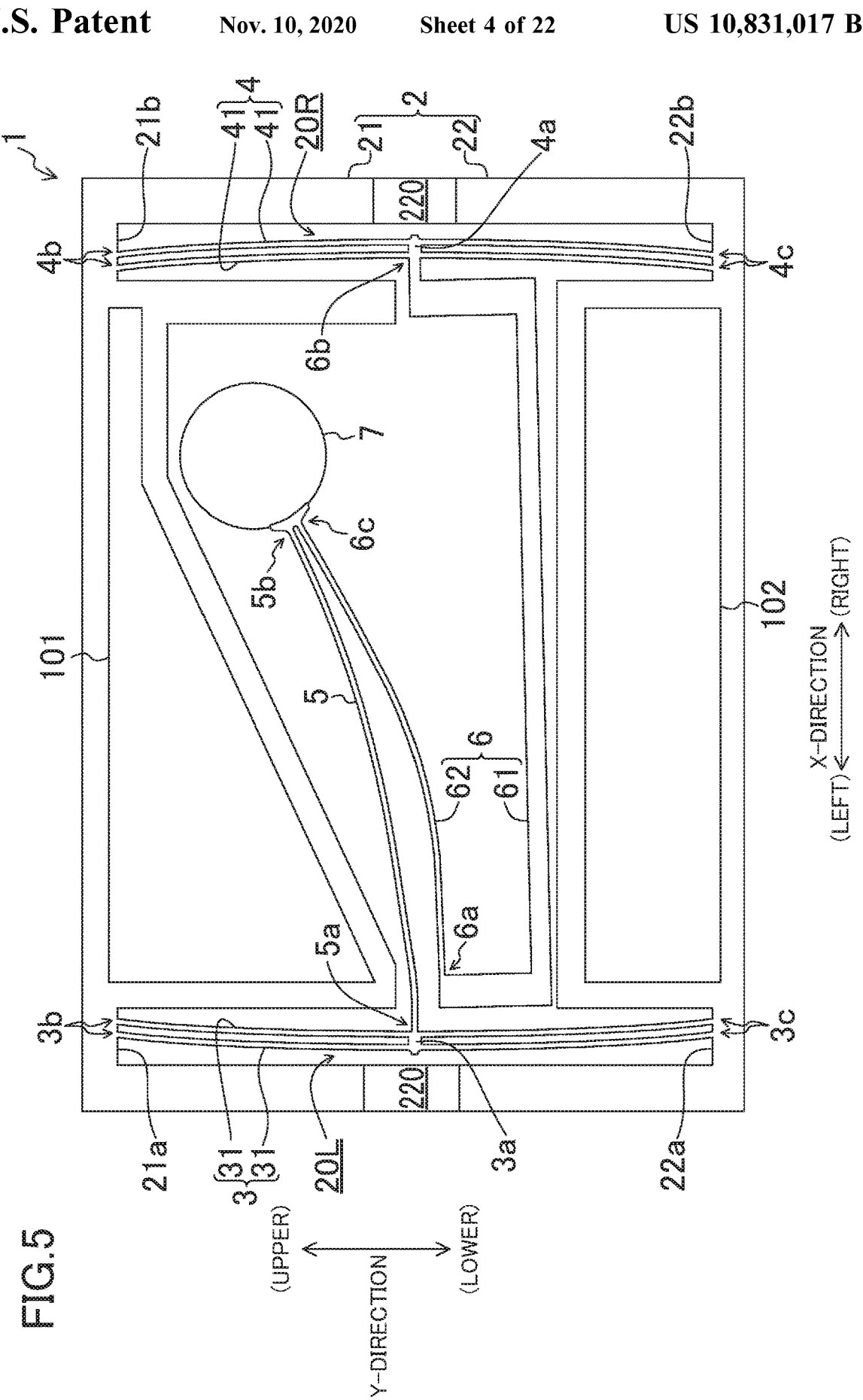
FIG. 5 is a plan view of the shutter device in a drive state.

Subsequently, operation of the shutter device 1 configured as described above will be described. FIG. 5 illustrates a plan view of the shutter device 1 in a drive state.

The shutter device 1 is driven in such a manner that voltage is applied to between the first electrode 101 and the second electrode 102. When the voltage is applied to between the first electrode 101 and the second electrode 102, current flows in the first actuator 3 and the second actuator 4 through the first base member 21 and the second base member 22. In this state, Joule heat is generated at the first actuator 3 and the second actuator 4 made of the silicon material, and the first actuator 3 and the second actuator 4 are instantaneously heated to 400 to 500° C.

The first actuator 3 thermally expands such that the entire length thereof is extended due to heating. The positions of the first end portion 3b and the second end portion 3c of the first actuator 3 are fixed by the fixing portion 2, and therefore, the first end portion 3b and the second end portion 3c are not movable. Thus, due to thermal expansion of the first actuator 3, the intermediate portion 3a is pushed to the left side in the X-direction as a direction in which the intermediate portion 3a protrudes in advance.

Moreover, the second actuator 4 thermally expands such that the entire length thereof is extended due to heating. The positions of the first end portion 4b and the second end portion 4c of the second actuator 4 are fixed by the fixing portion 2, and therefore, the first end portion 4b and the second end portion 4c are not movable. Thus, due to thermal expansion of the second actuator 4, the intermediate portion 4a is pushed to the right side in the X-direction as a direction in which the intermediate portion 4a protrudes in advance.

When the intermediate portion 3a of the first actuator 3 is pushed to the left side in the X-direction, the first beam 5 coupled to the intermediate portion 3a is entirely pulled to the left side in the X-direction. Moreover, when the intermediate portion 4a of the second actuator 4 is pushed to the right side in the X-direction, the second beam 6 coupled to the intermediate portion 4a is entirely pulled to the right side in the X-direction.

That is, the relative positions of the first end portion 5a of the first beam 5 and the third end portion 6b of the second beam 6 change in a direction in which the first end portion 5a and the third end portion 6b are separated from each other.

Even when the second beam 6 is entirely pulled to the right side in the X-direction, the first member 61 of the second beam 6 is little elastically deformed. Thus, almost all of pulling force by the second beam 6 is concentrated on the end portion 6a, and is changed into the force of pushing the second member 62 to the right side in the X-direction. As a result, in the first beam 5 and the second member 62 of the second beam 6 arranged in parallel, the first beam 5 is pulled to the left side in the X-direction, and the second member 62 of the second beam 6 is pushed to the right side in the X-direction. Accordingly, the second end portion 5b of the first beam 5 and the fourth end portion 6c of the second beam 6 are driven diagonally to an upper left side on the XY plane. The first beam 5 and the second member 62 of the second beam 6 are greatly curved or bent with different curvatures, and the fourth end portion 6c of the second beam 6 pushes the drive target member 7. Meanwhile, the second end portion 5b of the first beam 5 pulls the drive target member 7. Accordingly, the first member 61 of the second beam 6 slightly rotates counterclockwise about the third end portion 6b as an axis on the XY plane, and the drive target member 7 is pushed to a position on the XY plane as illustrated in FIG. 5. Moreover, the second actuator 4 is configured such that multiple actuators are coupled as in the present embodiment. Thus, as compared to a case where a single actuator forms the second actuator 4, counterclockwise rotational stiffness of the first member 61 of the second beam 6 about the third end portion 6b as the axis on the XY plane can be enhanced.

When the voltage is no longer applied to between the first electrode 101 and the second electrode 102, no current flows in the first actuator 3 and the second actuator 4. Then, the first actuator 3 and the second actuator 4 are naturally and quickly cooled, and the entire lengths having been extended are changed back to original lengths. In this state, the intermediate portion 3a of the first actuator 3 pushed to the left side in the X-direction is pulled back to the right side in the X-direction, and the intermediate portion 4a of the second actuator 4 pushed to the right side in the X-direction are pulled back to the left side in the X-direction.

When the intermediate portion 3a of the first actuator 3 is pulled back to the right side in the X-direction, the first beam 5 coupled to the intermediate portion 3a is entirely pulled back to the right side in the X-direction. Moreover, when the intermediate portion 4a of the second actuator 4 is pulled back to the left side in the X-direction, the second beam 6 coupled to the intermediate portion 4a is entirely pulled back to the left side in the X-direction.

That is, the relative positions of the first end portion 5a of the first beam 5 and the third end portion 6b of the second beam 6 are changed in a direction in which the first end portion 5a and the second end portion 6b approach each other.

Even when the second beam 6 is entirely pulled back to the left side in the X-direction, the first member 61 of the second beam 6 is little elastically deformed. Thus, almost all of pull-in force by the second beam 6 is concentrated on the end portion 6a, and is changed into the force of pulling the second member 62 to the left side in the X-direction. As a result, in the first beam 5 and the second member 62 of the second beam 6 arranged in parallel, the first beam 5 is pulled to the right side in the X-direction, and the second member 62 of the second beam 6 is pushed to the left side in the X-direction. Accordingly, the second end portion 5b of the first beam 5 and the fourth end portion 6c of the second beam 6 are pushed back diagonally to a lower right side on the XY plane. The first beam 5 and the second member 62 of the second beam 6 having been curved or bent are changed back to original substantially-linear shapes. The first member 61 of the second beam 6 slightly rotates clockwise about the third end portion 6b as the axis on the XY plane, thereby returning to an original position. Accordingly, the drive target member 7 returns to a position on the XY plane as illustrated in FIG. 1.

As described above, the position of the drive target member 7 on the XY plane is switched as illustrated in FIGS. 5 and 1 by switching between voltage application (the drive state of the shutter device 1) to the electrode 101 and the electrode 102 and cancellation (a non-drive state of the shutter device 1) of voltage application. The not-shown light path is arranged to overlap with the drive target member 7 illustrated in FIG. 1 or the drive target member 7 illustrated in FIG. 5. By switching of the position of the drive target member 7 as illustrated in FIGS. 5 and 1, the drive target member 7 functions as a shutter configured to close or open the not-shown light path. It may be configured such that the drive target member 7 closes the not-shown light path at such a position that the drive target member 7 is not driven by the first actuator 3 and the second actuator 4 and the light path is opened at a position at the time of driving. Conversely, it may be configured such that the not-shown light path is opened in such a state that the drive target member 7 is not driven by the first actuator 3 and the second actuator 4 and the light path is closed at a position at the time of driving.

In the present embodiment, the configuration of the actuator employing the thermal drive technique of driving the drive target member 7 by thermal expansion of the components has been described as an example. However, as long as the first beam 5 and the second beam 6 are driven as described above, other techniques than the thermal drive technique, such as a capacitance drive technique or a piezoelectric drive technique, may be employed. Moreover, the shutter is a concept including a light attenuator configured to close or open part of the light path in addition to closing or opening of the light path.

[Method for Manufacturing Shutter Device]

Figure 6:
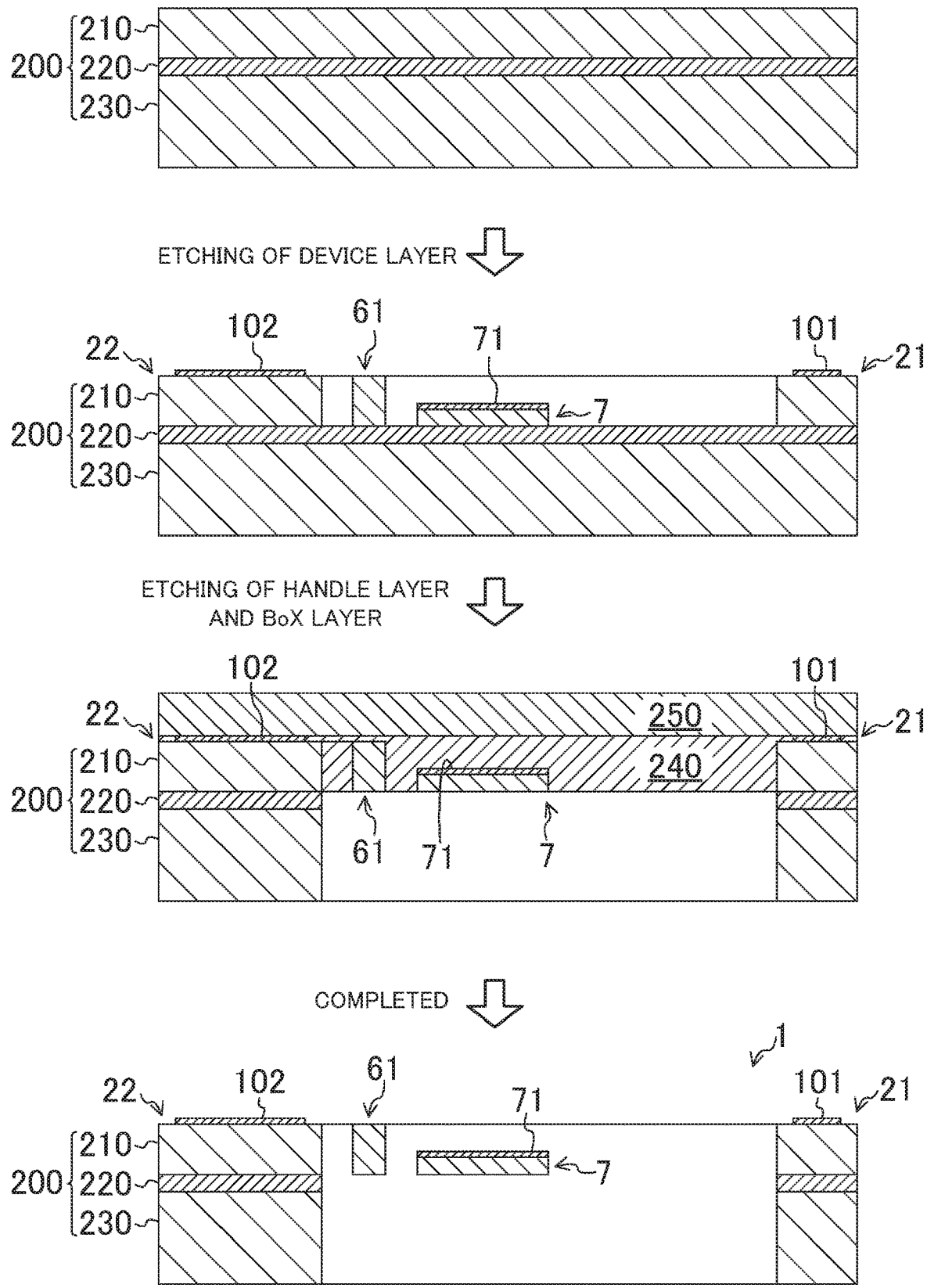
FIG. 6 is a view of the steps of manufacturing the shutter device.

Subsequently, the method for manufacturing the shutter device 1 will be described. FIG. 6 illustrates the steps of manufacturing the shutter device 1. Note that a view of each manufacturing step illustrated in FIG. 6 corresponds to a sectional view along the II-II line of FIG. 1.

First, a SOI wafer (the SOI substrate 200) including a device layer (the first silicon layer 210), a Box layer (the oxide film layer 220), and a handle layer (the second silicon layer 230) is prepared. For example, the thickness of the device layer is 30 µm, the thickness of the Box layer is 1 µm, and the thickness of the handle layer is 250 µm.

Etching processing is performed for the device layer, and in this manner, the displacement increasing mechanism including the fixing portion 2, the first actuator 3, the second actuator 4, the first beam 5, the second beam 6, and the drive target member 7 is integrally formed at the device layer. Note that in FIG. 6, only part of the displacement increasing mechanism is illustrated for the sake of convenience.

In particular, the drive target member 7 is thinly formed to have a thickness of about 7 µm in such a manner that etching is performed one more time than the number of times of etching for other members. That is, although not shown in the figure, the thickness of the drive target member 7 is less than those of the first actuator 3, the second actuator 4, the first beam 5, and the second beam 6. Further, the first electrode 101 is formed on the surface of the first base member 21, the second electrode 102 is formed on the surface of the second base member 22, and the metal film 71 is formed on the surface of the drive target member 7. The electrodes 101, 102 and the metal film 71 are, for example, an Au/Ti film containing Ti with a thickness of 20 nm and Au with a thickness of 300 nm.

When an original form of the shutter device 1 is formed at the device layer, a dummy wafer 250 is bonded to the device layer with wax 240, and etching processing is performed for a back layer, i.e., the Box layer and the handle layer, of the shutter device 1. By such etching processing, the SOI substrate 200 remains at the fixing portion 2, and only the device layer remains at the first actuator 3, the second actuator 4, the first beam 5, the second beam 6, and the drive target member 7 as other movable members in the displacement increasing mechanism.

Finally, the wax 240 and the dummy wafer 250 are removed, and the shutter device 1 is completed.

[Advantageous Effects]

Thus, the displacement increasing mechanism has the fixing portion 2, the first actuator 3 and the second actuator 4 coupled to the fixing portion 2, the first beam 5 having the first end portion 5a and the second end portion 5b and coupled to the first actuator 3 at the first end portion 5a, the second beam 6 having the third end portion 6b and the fourth end portion 6c and coupled to the second actuator 4 at the third end portion 6b, and the drive target member 7 coupled to the second end portion 5b of the first beam 5 and the fourth end portion 6c of the second beam 6. The first beam 5 is configured to pull the drive target member 7 from the second end portion 5b in the direction of extending the first beam 5, and the second beam 6 is configured to push the drive target member 7 from the fourth end portion 6c in the direction of extending the second beam 6.

According to this configuration, the first actuator 3 and the second actuator 4 are coupled to the fixing portion 2, the first end portion 5a of the first beam 5 is coupled to the first actuator 3, the third end portion 6b of the second beam 6 is coupled to the second actuator 4, and the drive target member 7 is coupled to the second end portion 5b of the first beam 5 and the fourth end portion 6c of the second beam 6. The first beam 5 pulls the drive target member 7 from the second end portion 5b in the direction of extending the first beam 5, whereas the second beam 6 pushes the drive target member 7 from the fourth end portion 6c in the direction of extending the second beam 6. Accordingly, the drive target member 7 coupled to these two beams 5, 6 is driven. That is, the drive target member 7 is driven by a combination of drive forces of the first beam 5 and the second beam 6 each driven by the first actuator 3 and the second actuator 4. Thus, the drive target member 7 can be greatly displaced by slight displacement of the first actuator 3 and the second actuator 4 as drive members.

Moreover, the above-described shutter device 1 includes the displacement increasing mechanism integrally formed from the semiconductor material, the first electrode 101 arranged on the fixing portion 2 of the displacement increasing mechanism and electrically connected to the first end portion 3b of the first actuator 3 and the first end portion 4b of the second actuator 4 in the displacement increasing mechanism, and the second electrode 102 arranged on the fixing portion 2 of the displacement increasing mechanism and electrically connected to the second end portion 3c of the first actuator 3 and the second end portion 4c of the second actuator 4 in the displacement increasing mechanism. The drive target member 7 of the displacement increasing mechanism closes or opens the light path.

According to this configuration, when the voltage is applied to between the first electrode 101 and the second electrode 102, the current flows in the first actuator 3 and the second actuator 4, and the first actuator 3 and the second actuator 4 are heated and thermally expanded. In this manner, the first beam 5 and the second beam 6 are driven to drive the drive target member 7 coupled to these two beams 5, 6. Thus, the drive target member 7 can be greatly displaced by low-voltage application to between the first electrode 101 and the second electrode 102.

[Variations of Shutter Device]

Subsequently, variations of the shutter device 1 will be described.

Note that each of the first actuator 3 and the second actuator 4 may include a single actuator (see FIGS. 12 to 18(B), 21, and 22). Moreover, the first actuator 3 and the second actuator 4 do not necessarily have the same size or structure, and may have different sizes or structures. The number of actuators may be different between the first actuator 3 and the second actuator 4. For example, the first actuator 3 may include a single actuator, and the second actuator 4 may include two actuators. Further, the length of the member forming the first actuator 3 and the length of the member forming the second actuator 4 may be different from each other. In addition, the technique of driving the actuator may vary. For example, the first actuator 3 may employ the thermal drive technique, and the second actuator 4 may employ the capacitance drive technique. Moreover, only either one of the first actuator 3 or the second actuator 4 may be driven to drive the drive target member 7. Further, either one of the first actuator 3 or the second actuator 4 may be omitted (see FIGS. 21 and 22). In all embodiments including variations described below, the above-described configurations can be applied to the corresponding members.

<<First Variation>>

Figure 7:
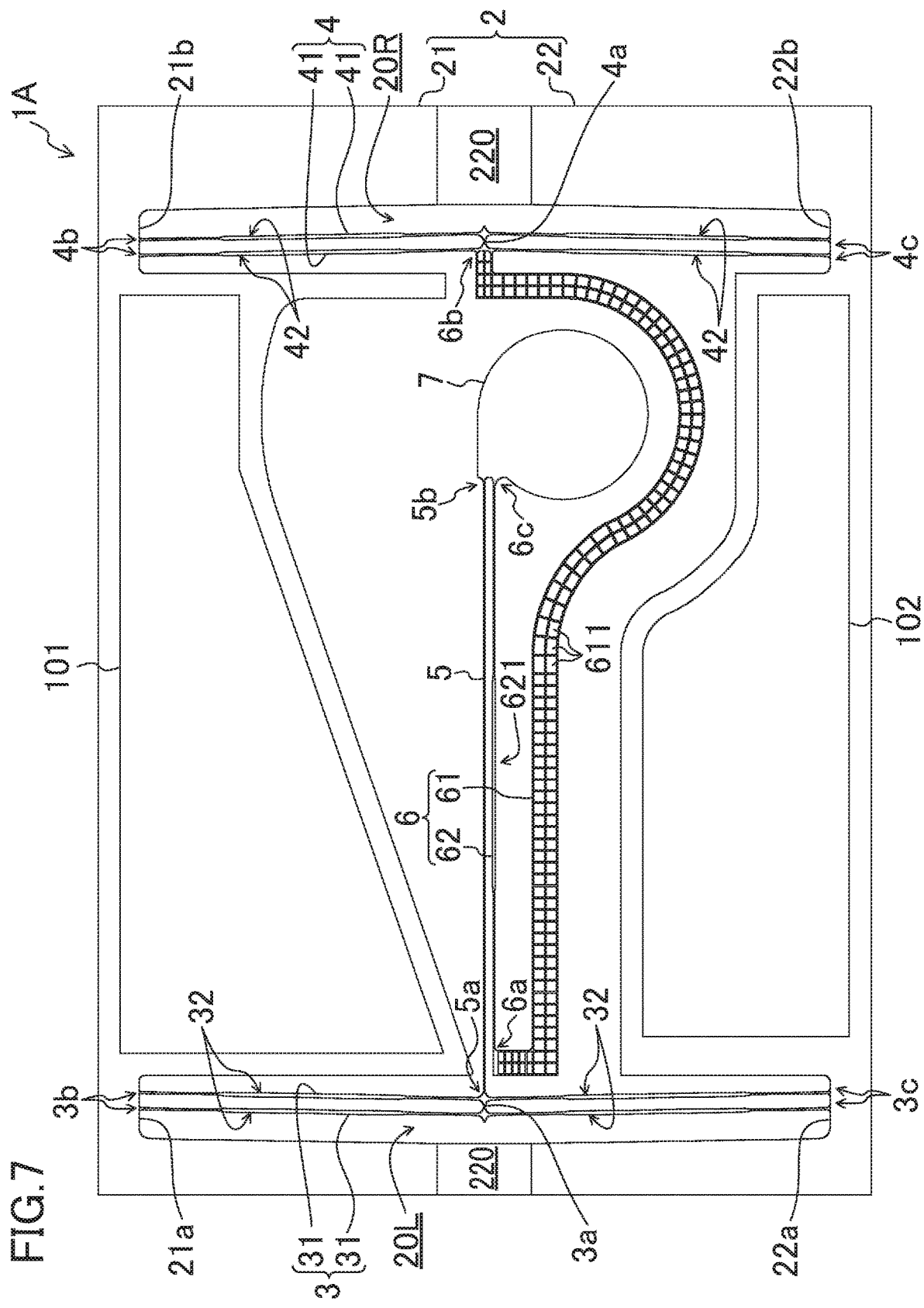
FIG. 7 is a plan view of a shutter device according to a first variation.

FIG. 7 illustrates a plan view of a shutter device 1A according to a first variation. In the shutter device 1A, the first member 61 of the second beam 6 is formed in such a hook shape that a space between the first member 61 and the second member 62 is narrowed from the end portion 6a to the third end portion 6b along the second member 62 and the drive target member 7. Moreover, as compared to the configuration of FIG. 1, lightening portions (holes) 611 are formed at the first member 61 of the second beam 6. With this configuration, advantageous effects that the mass of the first member 61 is decreased and the resonance frequency is increased are obtained. Further, in the case of using the actuator employing the thermal drive technique, the surface area of the first member 61 is increased due to part of the second beam 6, i.e., a lightening structure of the first member 61, and therefore, radiation is promoted. Thus, heat transmitted from the second actuator 4 to the drive target member 7 can be reduced. Note that as necessary, one or both of the first beam 5 and the second beam 6 can be provided with the lightening portions.

Moreover, at a center portion of the second member 62 of the second beam 6 in the longitudinal direction, e.g., a highly-elastic region 621 slightly formed wide is provided for increasing elasticity in a substrate surface direction than those of other regions of the second member 62. Generally, in an elongated member, stress is concentrated on a center portion in a longitudinal direction, and deformation easily occurs. Such deformation can be reduced by an increase in elasticity (stiffness) of the center portion. In the present variation, the highly-elastic region 621 is provided at the center portion of the rod-shaped second member 62 in the longitudinal direction. Thus, deformation at such a spot can be reduced, and a decrease in the amount of movement of the drive target member 7 can be suppressed in such a manner that the first beam 5 is deformed preferentially. In a case where the highly-elastic region 621 of the second member 62 is formed wider than other regions of the second member 62, the surface area of the second member 62 is increased, and therefore, a radiation effect is enhanced. Thus, the highly-elastic region 621 can be a radiation region where heat transfer to the drive target member 7 upon use of the actuator employing the thermal drive technique can be reduced. For enhancing the elasticity of the second member 62, the second member 62 may be formed wide or other metal films may be formed in addition to the above-described technique. For relatively decreasing the elastic modulus of a partial region of the second member 62 of the second beam 6 than those of other regions, such a partial region may be formed narrowly. In the present variation, the elastic modulus of the partial region of the second member 62 of the second beam 6 is relatively higher or lower than those of other regions, but in the first member 61 of the second beam 6, may be relatively higher or lower than those of other regions by means of a configuration similar to that of the second member 62.

Further, at a center portion between the intermediate portion 3a and the first end portion 3b and a center portion between the intermediate portion 3a and the second end portion 3c at each of the two actuators 31 forming the first actuator 3, e.g., highly-elastic regions 32 formed slightly wide are provided for increasing the elasticity in the substrate surface direction than those of other regions of the actuator 31. Similarly, at a center portion between the intermediate portion 4a and the first end portion 4b and a center portion between the intermediate portion 4a and the second end portion 4c at each of the two actuators 41 forming the second actuator 4, e.g., highly-elastic regions 42 formed slightly wide are provided for increasing the elasticity in the substrate surface direction than those of other regions of the actuator 41. In the highly-elastic region 32, the elasticity is relatively higher than those of other regions of the actuator 31, i.e., that of each peripheral region of the first end portion 3b, the second end portion 3c, and the intermediate portion 3a. Thus, when the first actuator 3 is heated and expanded, a deflection amount in the highly-elastic region 32 is less than that in each peripheral region. Thus, a deformation amount in the vicinity of the first end portion 3b, the second end portion 3c, and the intermediate portion 3a becomes greater. The same applies to the highly-elastic region 42 in the actuator 41. Note that for increasing the elasticity of the actuator 31, 41, the actuator 31, 41 may be formed wide or other metal films may be formed in addition to the above-described technique.

As described above, the center portion between the intermediate portion 3a and the first end portion 3b of the first actuator 3, the center portion between the intermediate portion 3a and the second end portion 3c of the first actuator 3, the center portion between the intermediate portion 4a and the first end portion 4b of the second actuator 4, and the center portion between the intermediate portion 4a and the second end portion 4c of the second actuator 4 are formed wide, and therefore, a decrease in the drive amounts of the intermediate portion 3a of the first actuator 3 and the intermediate portion 4a of the second actuator 4 due to deformation of the center portions where deformation easily occurs can be suppressed.

In addition, at the openings 20L, 20R, each corner portion is in a chamfered shape with a curvature. With this shape of each opening, stress concentration on the corner portion can be reduced, and stiffness of the opening can be enhanced. For example, when the shutter device 1A is mounted on, e.g., a mounting substrate (not shown), stress is concentrated on the corner portions due to a difference in a coefficient of thermal expansion between the shutter device 1A and the mounting substrate, and the shutter device 1A might be deformed. When such deformation is great, cracks might be caused at the first and second base members 21, 22, or in some cases, the shutter device 1A might be damaged. According to the configuration of the present variation, occurrence of such deformation and damage can be prevented. Note that the structure in which each corner portion is in the chamfered shape is, needless to say, applicable to the shutter device 1A illustrated in FIG. 1 and configurations described in subsequent variations.

<<Second Variation>>

Figure 8:
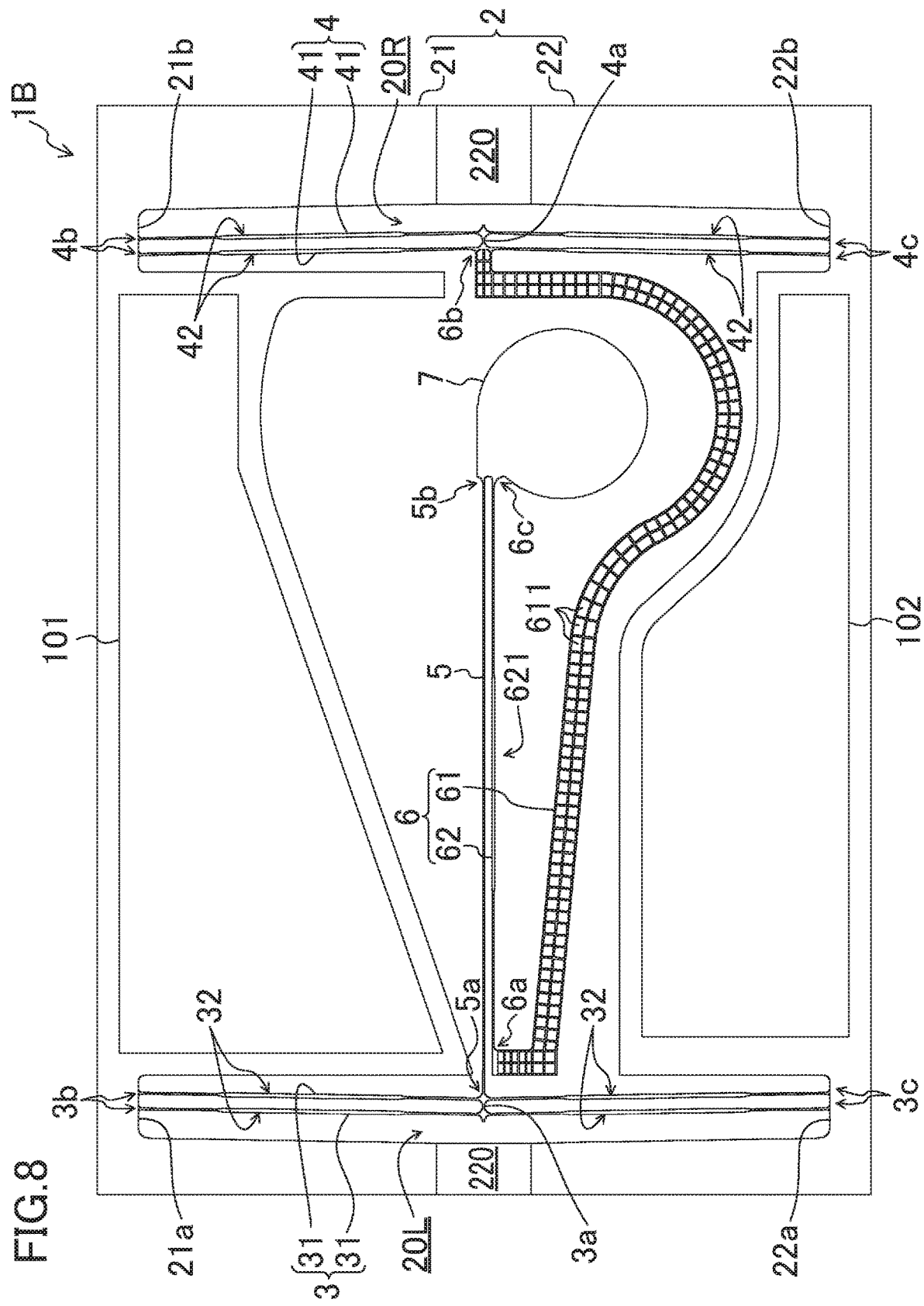
FIG. 8 is a plan view of a shutter device according to a second variation.

FIG. 8 illustrates a plan view of a shutter device 1B according to a second variation. As compared to the shutter device 1A of FIG. 7, the first member 61 of the second beam 6 is, in the shutter device 1B, formed slightly diagonally to the second member 62 such that a spacing between the first member 61 and the second member 62 of the second beam 6 is gradually narrowed toward the end portion 6a. Even when the first member 61 of the second beam 6 is slightly inclined as described above, the second beam 6 can transmit the drive force of the second actuator 4 to the drive target member 7 as in the shutter device 1A of FIG. 7.

<<Third Variation>>

Figure 9:
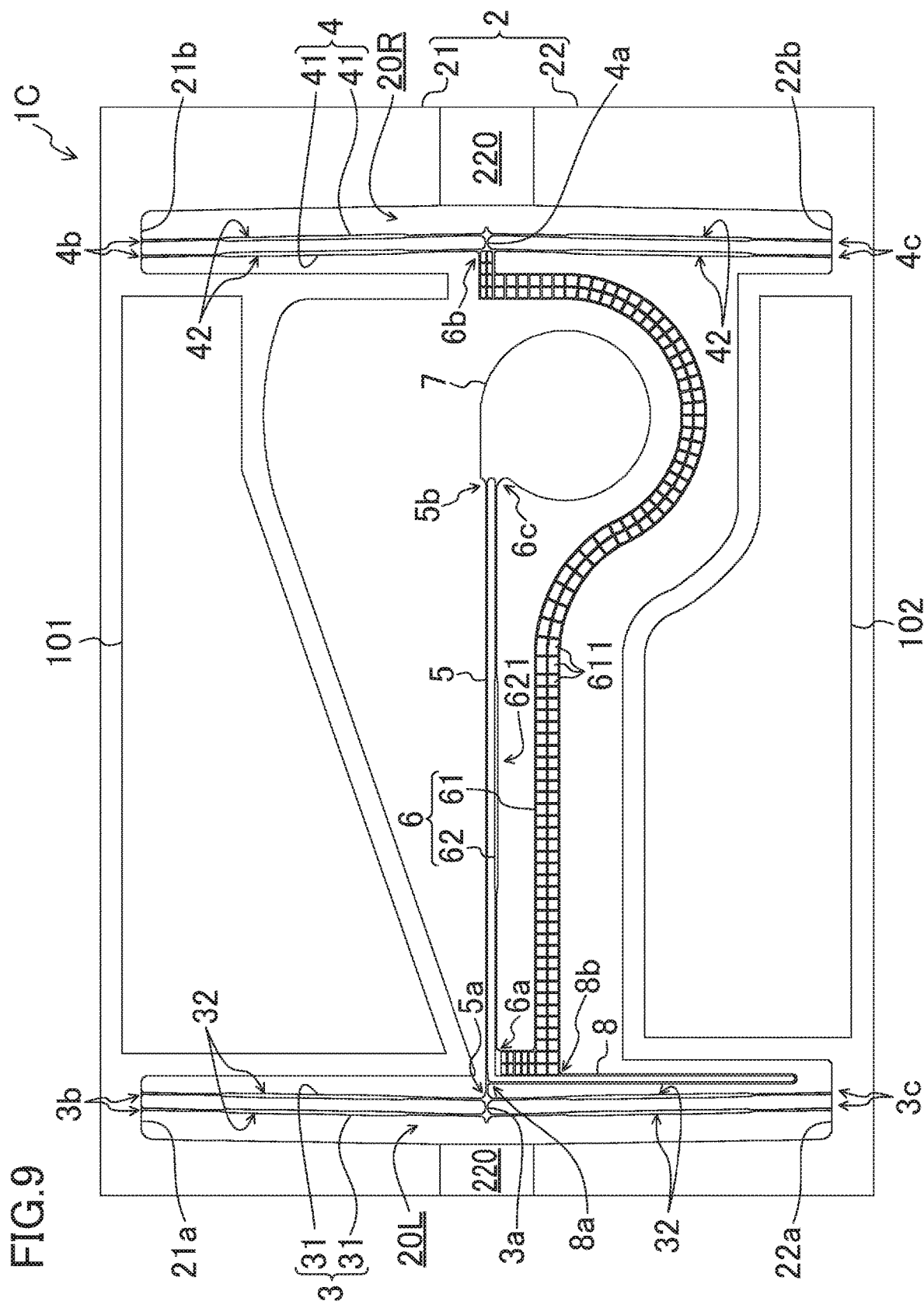
FIG. 9 is a plan view of a shutter device according to a third variation.

FIG. 9 illustrates a plan view of a shutter device 1C according to a third variation. The shutter device 1C is configured in such a manner that a coupling member 8 is added to the shutter device 1A of FIG. 7.

The coupling member 8 is a hairpin-shaped member formed at the opening 20L. A first end portion 8a is coupled to the vicinity of the first end portion 5a of the first beam 5, and is folded back to extend apart from the first beam 5 in a direction substantially perpendicular to the first beam 5. A second end portion 8b is coupled to the vicinity of the end portion 6a of the second beam 6, and couples the first beam 5 and the second beam 6 to each other. Of the first beam 5, a portion coupled to the first end portion 8a of the coupling member 8, i.e., the vicinity of the first end portion 5a of the first beam 5, is formed slightly wide for increasing strength. With such a coupling member 8, when the third end portion 6b of the second beam 6 is driven, slight counterclockwise rotation of the first member 61 of the second beam 6 about the third end portion 6b as the axis on the XY plane as illustrated in FIG. 5 can be prevented, and the drive amount of the drive target member 7 can be increased. In the case of the actuator employing the thermal drive technique, radiation is also allowed at the coupling member 8, and therefore, heat transfer to the drive target member 7 can be prevented. Moreover, great reduction in the drive amount of the third end portion 6b by the second actuator 4 can be suppressed. Further, as another example for preventing the above-described rotation, the coupling member 8 may be coupled to the fixing portion 2 (more specifically, the second base member 22) after having extended from the vicinity of the end portion 6a of the second beam 6 in a direction substantially perpendicular to the second beam 6. Moreover, a not-shown anti-rotation structure configured to prevent rotation by contact between the first member 61 and the fixing portion 2 (more specifically, the second base member 22) upon rotation of the first member 61 may be provided at the fixing portion 2 or the first member 61. Note that the direction of extending the coupling member 8 is not limited to the direction substantially perpendicular to the first beam 5 and the second beam 6, and may be a direction crossing the first beam 5 or the second beam 6.

<<Fourth Variation>>

Figure 10:
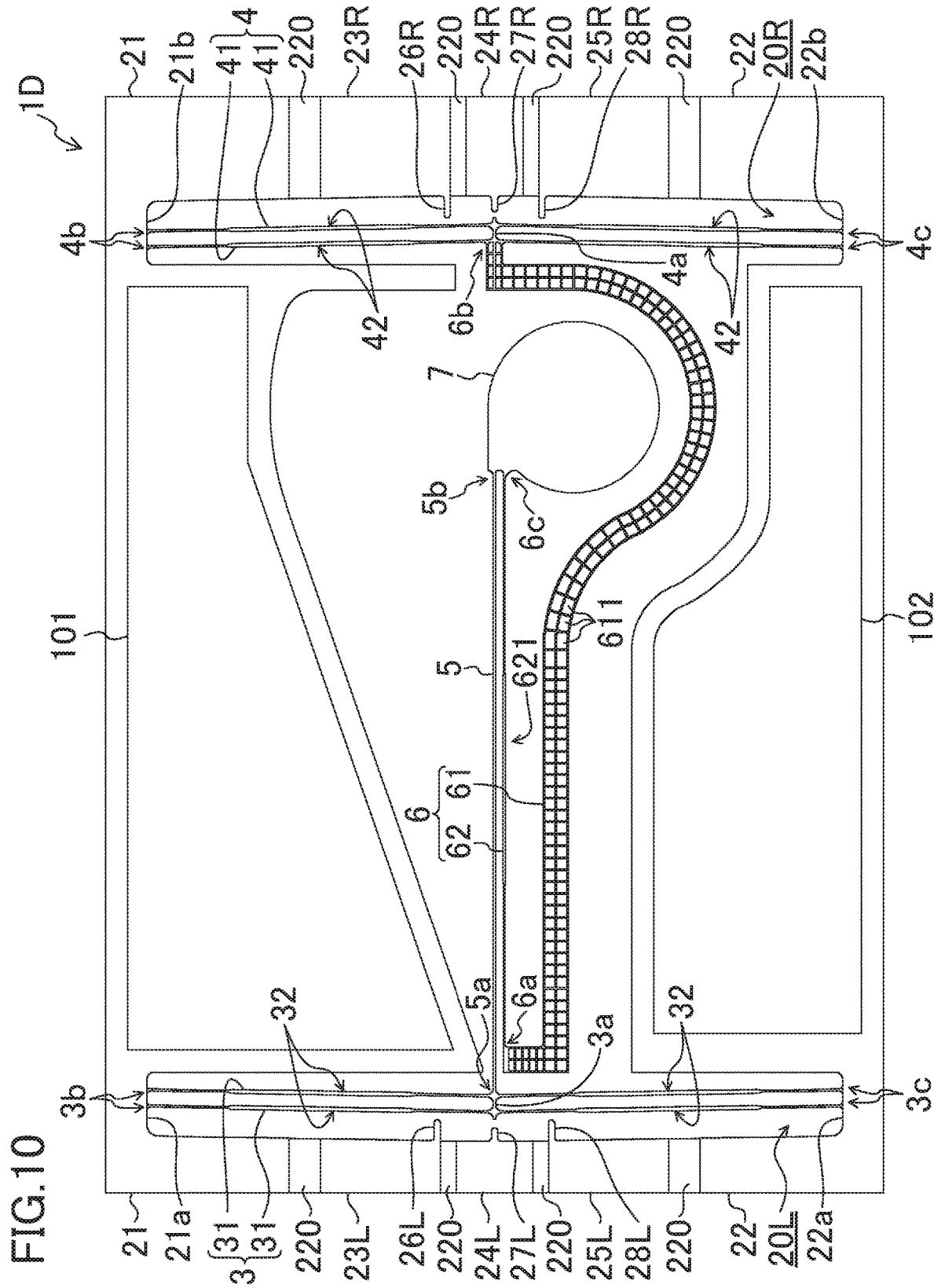
FIG. 10 is a plan view of a shutter device according to a fourth variation.

FIG. 10 illustrates a plan view of a shutter device 1D according to a fourth variation. The shutter device 1D is configured in such a manner that buffer members 23L, 24L, 25L, 23R, 24R, 25R are added to the shutter device 1A of FIG. 7.

In the shutter device 1D, the first base member 21 and the second base member 22 forming the fixing portion 2 are, as compared to the shutter device 1A of FIG. 7, formed such that lengths in the Y-direction at both right and left ends in the X-direction are shorter. The buffer member 24L is arranged at the center between the first base member 21 and the second base member 22 at the left end of the shutter device 1D in the X-direction, and the buffer members 23L, 25L are arranged on upper and lower sides of the buffer member 24L in the Y-direction. That is, the buffer members 23L, 24L, 25L are provided at the fixing portion 2, and part of the left side of the rectangular shutter device 1D in the X-direction as viewed in the plane forms the buffer members 23L, 24L, 25L. Moreover, the buffer members 23L, 24L, 25L each have protruding portions 26L, 27L, 28L protruding to the right side in the X-direction. Similarly, the buffer member 24R is arranged at the center between the first base member 21 and the second base member 22 at the right end of the shutter device 1D in the X-direction, and the buffer members 23R, 25R are arranged on upper and lower sides of the buffer member 24R in the Y-direction. That is, the buffer members 23R, 24R, 25R are provided at the fixing portion 2, and part of the right side of the rectangular shutter device 1D in the X-direction as viewed in the plane forms the buffer members 23R, 24R, 25R. Moreover, the buffer members 23R, 24R, 25R each have protruding portions 26R, 27R, 28R protruding to the left side in the X-direction.

In a state in which the first actuator 3 is not driven, a slight clearance is present between the protruding portion 26L, 27L, 28L and the first actuator 3. When the first actuator 3 is driven and is bent or curved to protrude to the left side in the X-direction to a certain degree, the first actuator 3 comes into contact with tip ends of the protruding portions 26L, 27L, 28L, and therefore, further driving of the intermediate portion 3a of the first actuator 3 to the left side in the X-direction can be restricted. Similarly, in a state in which the second actuator 4 is not driven, a slight clearance is present between the protruding portion 26R, 27R, 28R and the second actuator 4. When the second actuator 4 is driven and is bent or curved to protrude to the right side in the X-direction to a certain degree, the second actuator 4 comes into contact with tip ends of the protruding portions 26R, 27R, 28R, and therefore, further driving of the intermediate portion 4a of the second actuator 4 to the right side in the X-direction can be restricted.

As described above, the drive amounts of the intermediate portion 3a of the first actuator 3 and the intermediate portion 4a of the second actuator 4 are limited, and therefore, collision and damage of the first base member 21 due to driving of the drive target member 7 beyond necessity can be prevented. Further, each of the buffer members 23L, 24L, 25L, 23R, 24R, 25R is formed in an independent island shape. Thus, when the first actuator 3 contacts the protruding portions 26L, 27L, 28L, heat is transferred from the first actuator 3 to the buffer members 23L, 24L, 25L, and is easily radiated. Moreover, when the second actuator 4 contacts the protruding portions 26R, 27R, 28R, heat is transferred from the second actuator 4 to the buffer members 23R, 24R, 25R, and is easily radiated. Thus, an increase in the temperature of the first actuator 3 or the second actuator 4 can be suppressed. Further, the first actuator 3 is driven to contact the protruding portions 26L, 28L or the second actuator 4 is driven to contact the protruding portions 26R, 28R so that counterclockwise rotation of the first member 61 of the second beam 6 about the third end portion 6b as the axis beyond necessity upon driving of the drive target member 7 can be prevented.

Note that when the first actuator 3 and the second actuator 4 contact these protruding portions of the buffer members, the current flowing in the first actuator 3 and the second actuator 4 flows into these buffer members. However, the buffer members 23L, 24L, 25L, 23R, 24R, 25R, the first base member 21, and the second base member 22 are electrically insulated from each other, and exhibit high electric resistance. Thus, even when the current flowing in the first actuator 3 and the second actuator 4 flows into these buffer members, such a situation does not influence driving of the first actuator 3 and the second actuator 4.

<<Fifth Variation>>

Figure 11:
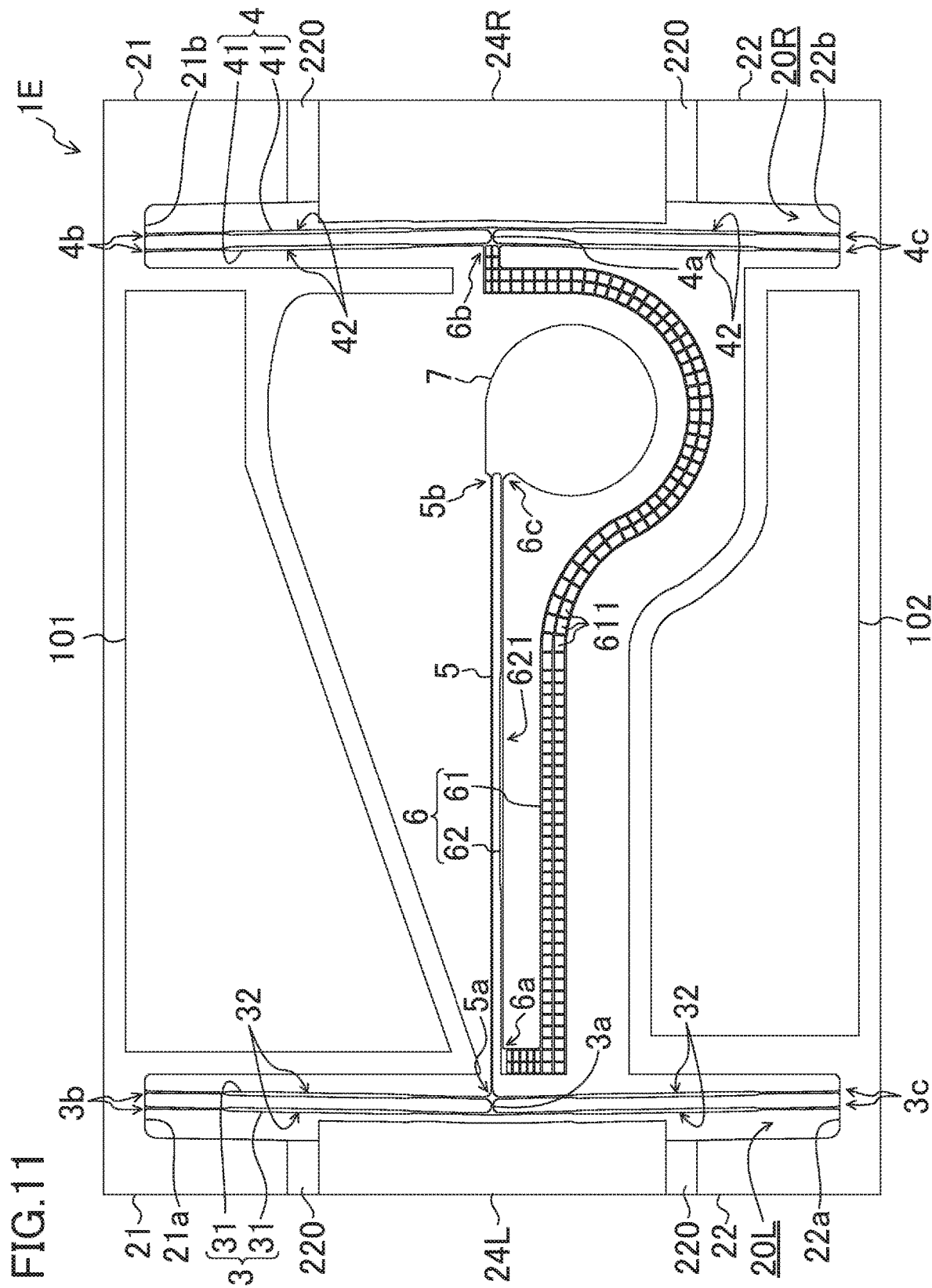
FIG. 11 is a plan view of a shutter device according to a fifth variation.

FIG. 11 illustrates a plan view of a shutter device 1E according to a fifth variation. The shutter device 1E is configured in such a manner that the buffer members 24L, 24R in shapes different from those of the shutter device 1D of FIG. 10 are added to the shutter device 1A of FIG. 7. Unlike the shutter device 1D of FIG. 10, the first actuator 3 and the second actuator 4 are formed flat without protrusions at the intermediate portion 3a and the intermediate portion 4a.

In the shutter device 1E, the first base member 21 and the second base member 22 forming the fixing portion 2 are, as compared to the shutter device 1A of FIG. 7, formed such that the lengths in the Y-direction at both right and left ends in the X-direction are shorter. The buffer member 24L is arranged between the first base member 21 and the second base member 22 at the left end of the shutter device 1E in the X-direction. That is, part of the left side of the rectangular shutter device 1E in the X-direction as viewed in the plane forms the buffer member 24L. Moreover, the buffer member 24L is formed to slightly protrude to the opening 20L. Similarly, the buffer member 24R is arranged between the first base member 21 and the second base member 22 at the right end of the shutter device 1E in the X-direction. That is, part of the right side of the rectangular shutter device 1E in the X-direction as viewed in the plane forms the buffer member 24R. Moreover, the buffer member 24R is formed to slightly protrude to the opening 20R.

In a state in which the first actuator 3 is not driven, a slight clearance is present between the right end portion of the buffer member 24L in the X-direction and the first actuator 3. When the first actuator 3 is driven and is bent or curved to protrude to the left side in the X-direction to a certain degree, the first actuator 3 comes into contact with the right end portion of the buffer member 24L in the X-direction, and further driving of the intermediate portion 3a of the first actuator 3 to the left side in the X-direction is restricted. Similarly, in a state in which the second actuator 4 is not driven, a slight clearance is present between the left end portion of the buffer member 24R in the X-direction and the second actuator 4. When the second actuator 4 is driven and is bent or curved to protrude to the right side in the X-direction to a certain degree, the second actuator 4 comes into contact with the left end portion of the buffer member 24R in the X-direction, and further driving of the intermediate portion 4a of the second actuator 4 to the right side in the X-direction is restricted. That is, it can be said that the buffer members 24L are arranged within a drive area of the first actuator 3 and the buffer members 24R are arranged in a drive area of the second actuator 4.

As described above, the drive amounts of the intermediate portion 3a of the first actuator 3 and the intermediate portion 4a of the second actuator 4 are limited, and therefore, collision and damage of the first base member 21 due to driving of the drive target member 7 beyond necessity can be prevented. Further, each of the buffer members 24L, 24R is formed in an independent island shape. Thus, when the first actuator 3 contacts the buffer member 24L, heat is transferred from the first actuator 3 to the buffer member 24L, and is easily radiated. Moreover, when the second actuator 4 contacts the buffer member 24R, heat is transferred from the second actuator 4 to the buffer member 24R, and is easily radiated. Thus, an increase in the temperature of the first actuator 3 or the second actuator 4 can be suppressed. Specifically, as compared to the shutter device 1D of FIG. 10, the area of a contact portion between the first actuator 3 and the buffer member 24L and the area of a contact portion between the second actuator 4 and the buffer member 24R are larger in the shutter device 1E, leading to greater heat transfer from the first actuator 3 or the second actuator 4 to these buffer members. Thus, the effect of suppressing an increase in the temperature of the first actuator 3 or the second actuator 4 is high. Moreover, the first actuator 3 is driven to contact the buffer member 24L or the second actuator 4 is driven to contact the buffer member 24R, and therefore, counterclockwise rotation of the first member 61 of the second beam 6 about the third end portion 6b as the axis beyond necessity upon driving of the drive target member 7 can be prevented.

Note that when the first actuator 3 and the second actuator 4 contact these end portions of the buffer members, the current flowing in the first actuator 3 and the second actuator 4 flows into these buffer members. However, the buffer members 24L, 24R, the first base member 21, and the second base member 22 are electrically insulated from each other, and exhibit high electric resistance. Thus, even when the current flowing in the first actuator 3 and the second actuator 4 flows into these buffer members, such a situation does not influence driving of the first actuator 3 and the second actuator 4.

<<Sixth Variation>>

Figure 12:
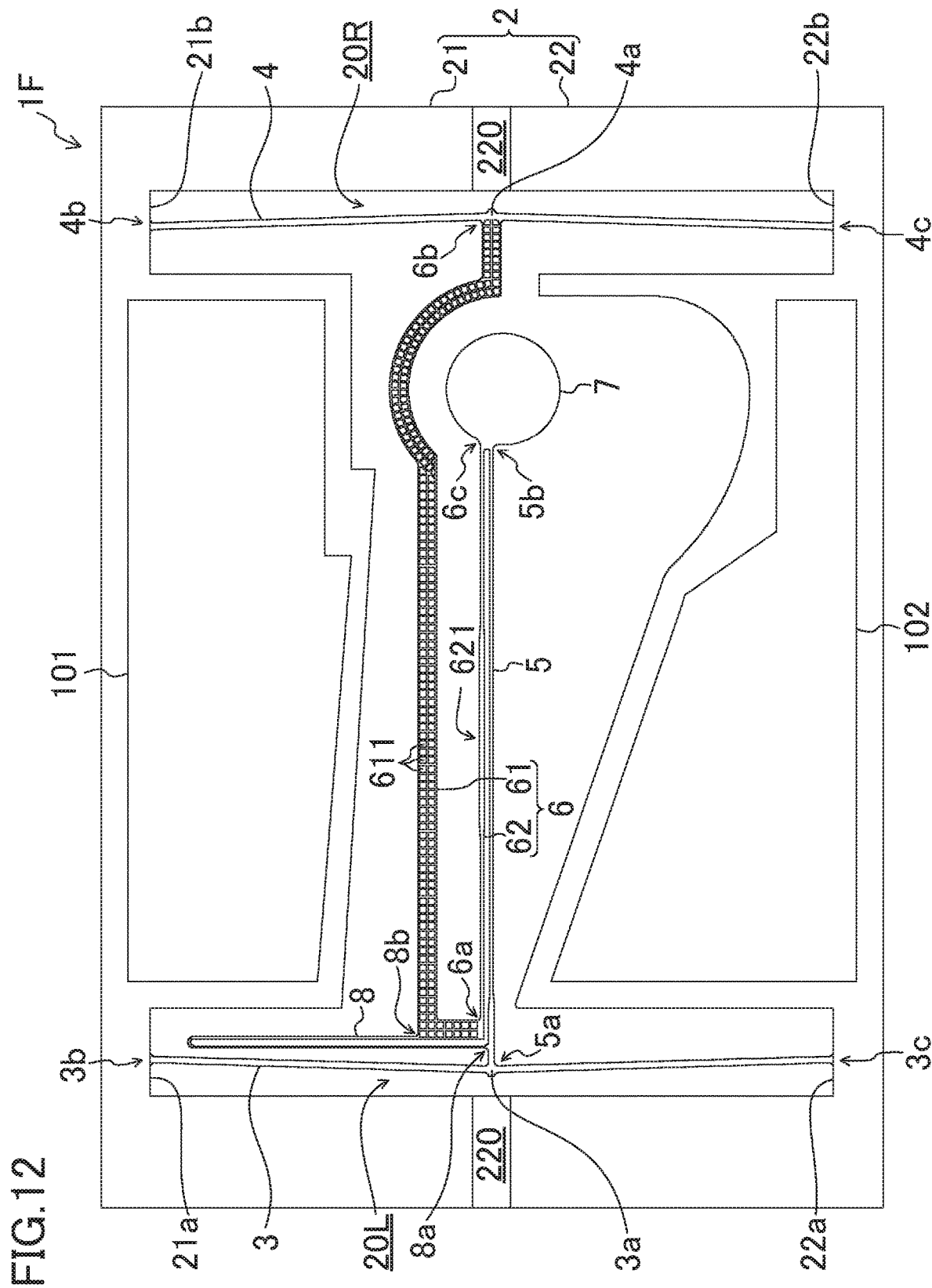
FIG. 12 is a plan view of a shutter device according to a sixth variation.

FIG. 12 illustrates a plan view of a shutter device 1F according to a sixth variation. The shutter device 1F is configured such that each of the first actuator 3 and the second actuator 4 includes a single actuator. Moreover, in the shutter device 1F, a position relationship between the first beam 5 and the second beam 6 is inverted in the Y-direction as compared to the shutter devices 1, 1A to 1E. Thus, the direction of driving the drive target member 7 on the XY plane is opposite to those of the cases of the shutter devices 1, 1A to 1E, and the drive target member 7 is driven diagonally to a lower left side on the XY plane. Note that the direction of driving the drive target member 7 varies according to the stiffness, shapes, etc. of the first beam 5 and the second beam 6, and driving in other directions such as the lower side is allowed in addition to driving diagonally to the lower left side.

At the center portion of the second member 62 of the second beam 6 in the longitudinal direction in the shutter device 1F, e.g., the highly-elastic region 621 formed slightly wide is provided for increasing the elasticity in the substrate surface direction than those of other regions of the second member 62. As described above, the highly-elastic region 621 is provided at the center portion of the second member 62 formed in the rod shape, and therefore, a decrease in the movement amount of the drive target member 7 due to deformation of the center portion of the second member 62 can be prevented. Moreover, in a case where the highly-elastic region 621 of the second member 62 is formed wider than those of other regions of the second member 62, the radiation effect can be enhanced due to an increase in the surface area of the second member 62, and the highly-elastic region 621 can be the radiation region where heat transfer to the drive target member 7 upon use of the actuator employing the thermal drive technique can be reduced. For enhancing the elasticity of the second member 62, the second member 62 may be formed wide or other metal films may be formed in addition to the above-described technique. Moreover, for relatively decreasing the elastic modulus of the partial region of the second member 62 of the second beam 6 than those of other regions, such a partial region may be formed narrowly. In the present variation, the elastic modulus of the partial region of the second member 62 of the second beam 6 is relatively higher or lower than those of other regions, but in the first member 61 of the second beam 6, may be relatively higher or lower than those of other regions by means of the configuration similar to that of the second member 62. Moreover, a region where the elastic modulus is relatively higher than those of other regions in the first beam 5 may be provided at the center portion of the first beam 5.

Further, the shutter device 1F includes the coupling member 8. The coupling member 8 is a hairpin-shaped member formed at the opening 20L. The first end portion 8a is coupled to the vicinity of the first end portion 5a of the first beam 5, and is folded back to extend apart from the first beam 5 in the direction substantially perpendicular to the first beam 5. The second end portion 8b is coupled to the vicinity of the end portion 6a of the second beam 6, and couples the first beam 5 and the second beam 6 to each other. Of the first beam 5, the portion coupled to the first end portion 8a of the coupling member 8, i.e., the vicinity of the first end portion 5a of the first beam 5, is formed slightly wide for increasing the strength. With such a coupling member 8, when the third end portion 6b of the second beam 6 is driven, slight clockwise rotation of the first member 61 of the second beam 6 about the third end portion 6b as the axis on the XY plane can be prevented, and the drive amount of the drive target member 7 can be increased. In the case of employing the actuator of the thermal drive technique, radiation is also allowed at the coupling member 8, and therefore, heat transfer to the drive target member 7 can be prevented. Moreover, great reduction in the drive amount of the third end portion 6b by the second actuator 4 can be suppressed. Further, as another example for preventing the above-described rotation, the coupling member 8 may be coupled to the fixing portion 2 (more specifically, the first base member 21) after having extended from the vicinity of the end portion 6a of the second beam 6 in the direction substantially perpendicular to the second beam 6. Moreover, the not-shown anti-rotation structure configured to prevent rotation by contact between the first member 61 and the fixing portion 2 (more specifically, the first base member 21) upon rotation of the first member 61 may be provided at the fixing portion 2 or the second member 62. Note that the direction of extending the coupling member 8 is not limited to the direction substantially perpendicular to the first beam 5 and the second beam 6, and may be the direction crossing the first beam 5 or the second beam 6.

<<Seventh Variation>>

Figure 13:
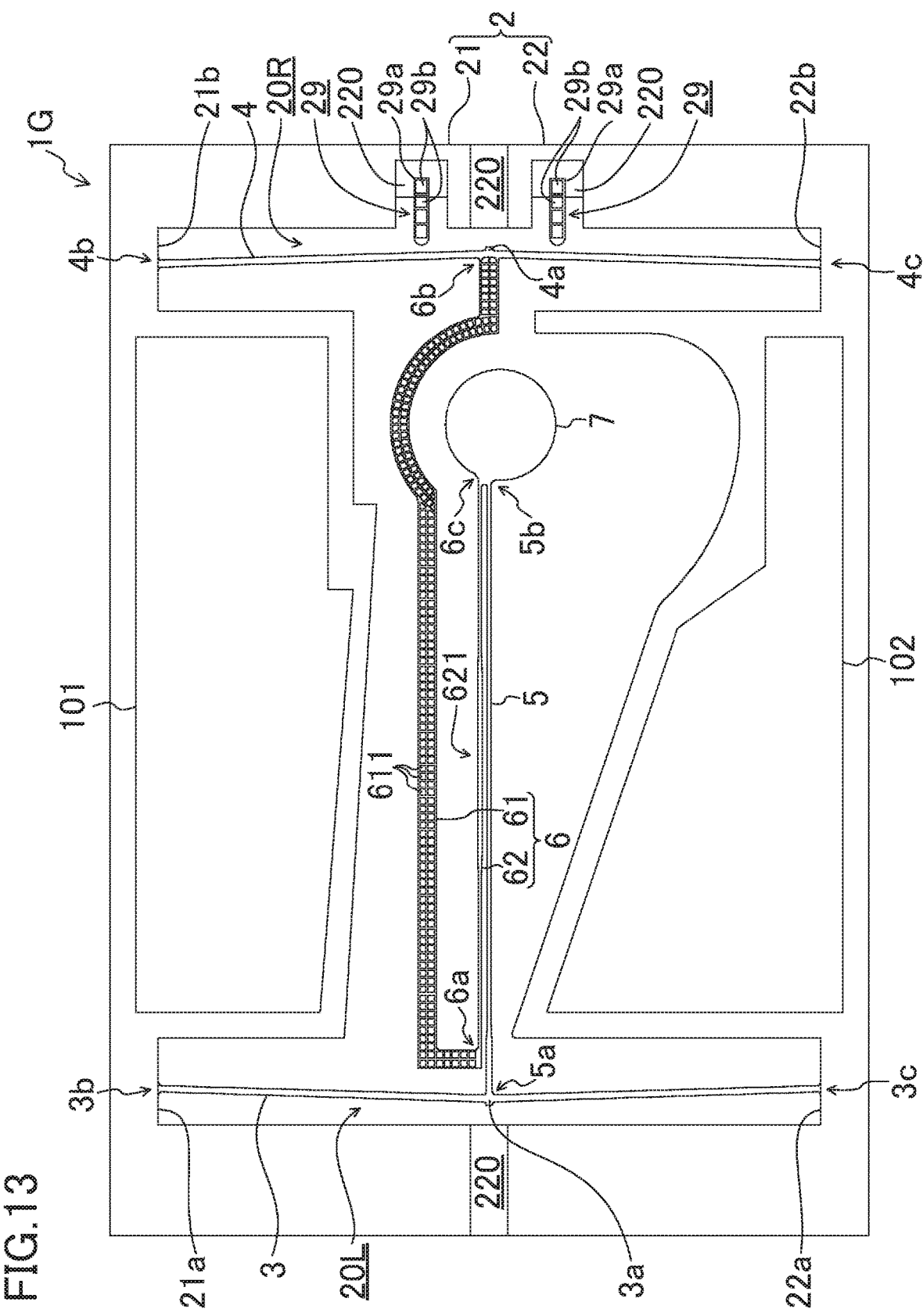
FIG. 13 is a plan view of a shutter device according to a seventh variation.

FIG. 13 illustrates a plan view of a shutter device 1G according to a seventh variation. The shutter device 1G is configured in such a manner that the coupling member 8 is omitted from the shutter device 1F of FIG. 12 and buffer members 29a are added to the shutter device 1F of FIG. 12.

In the shutter device 1G, right portions of the first base member 21 and the second base member 22, which form the fixing portion 2, in the X-direction are partially cut out to form cutout portions 29, and the buffer members 29a are each arranged in the cutout portions 29. The buffer members 29a are formed to protrude to the left side in the X-direction with respect to the second recessed portion 21b of the first base member 21 and the fourth recessed portion 22b of the second base member 22. Further, lightening portions (holes) 29b are formed at the buffer members 29a.

In a state in which the second actuator 4 is not driven, a slight clearance is present between each left tip end of the buffer members 29a in the X-direction and the second actuator 4. When the second actuator 4 is driven and is bent or curved to protrude to the right side in the X-direction to a certain degree, the second actuator 4 comes into contact with the left tip ends of the buffer members 29a in the X-direction, and further driving of the intermediate portion 4a of the second actuator 4 to the right side in the X-direction is restricted. That is, it can be said that the buffer members 29a are provided within the drive area of the second actuator 4.

As described above, the buffer members 29a are provided to limit the drive amount of the intermediate portion 4a of the second actuator 4, and therefore, collision and damage of the second base member 22 due to driving of the drive target member 7 beyond necessity can be prevented. Moreover, the second actuator 4 is driven to contact the buffer members 29a, and therefore, clockwise rotation of the first member 61 of the second beam 6 about the third end portion 6b as the axis beyond necessity upon driving of the drive target member 7 can be also prevented. Moreover, the lightening portions 29b are provided at the buffer members 29a so that a sectional area can be decreased and thermal resistance can be enhanced. Further, the buffer members 29a are provided to protrude to the left side in the X-direction from the oxide film layer 220, and therefore, a heat loss from the second actuator 4 to the buffer members 29a can be reduced.

Note that when the second actuator 4 contacts the tip ends of the buffer members 29a, the current flowing in the second actuator 4 flows into the buffer members 29a. However, the buffer members 29a, the first base member 21, and the second base member 22 are electrically insulated from each other, and exhibit high electric resistance. Thus, even when the current flowing in the first actuator 3 and the second actuator 4 flows into these buffer members, such a situation does not influence driving of the first actuator 3 and the second actuator 4.

<<Eighth Variation>>

Figure 14:
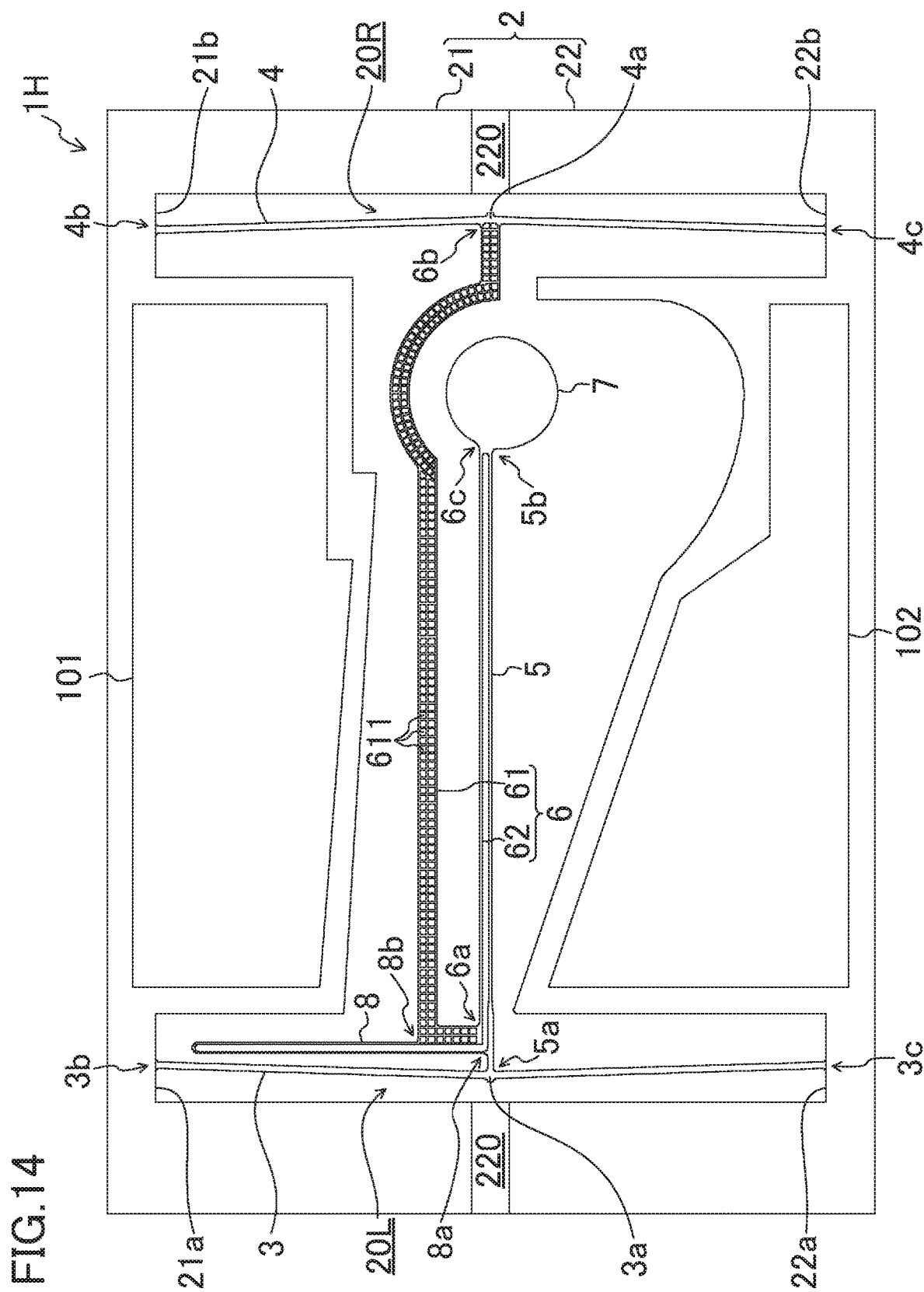
FIG. 14 is a plan view of a shutter device according to an eighth variation.

FIG. 14 illustrates a plan view of a shutter device 1H according to an eighth variation. Unlike the shutter device 1F of FIG. 12, the shutter device 1H is configured such that the second member 62 of the second beam 6 is formed with a substantially constant width.

<<Ninth Variation>>

Figure 15:
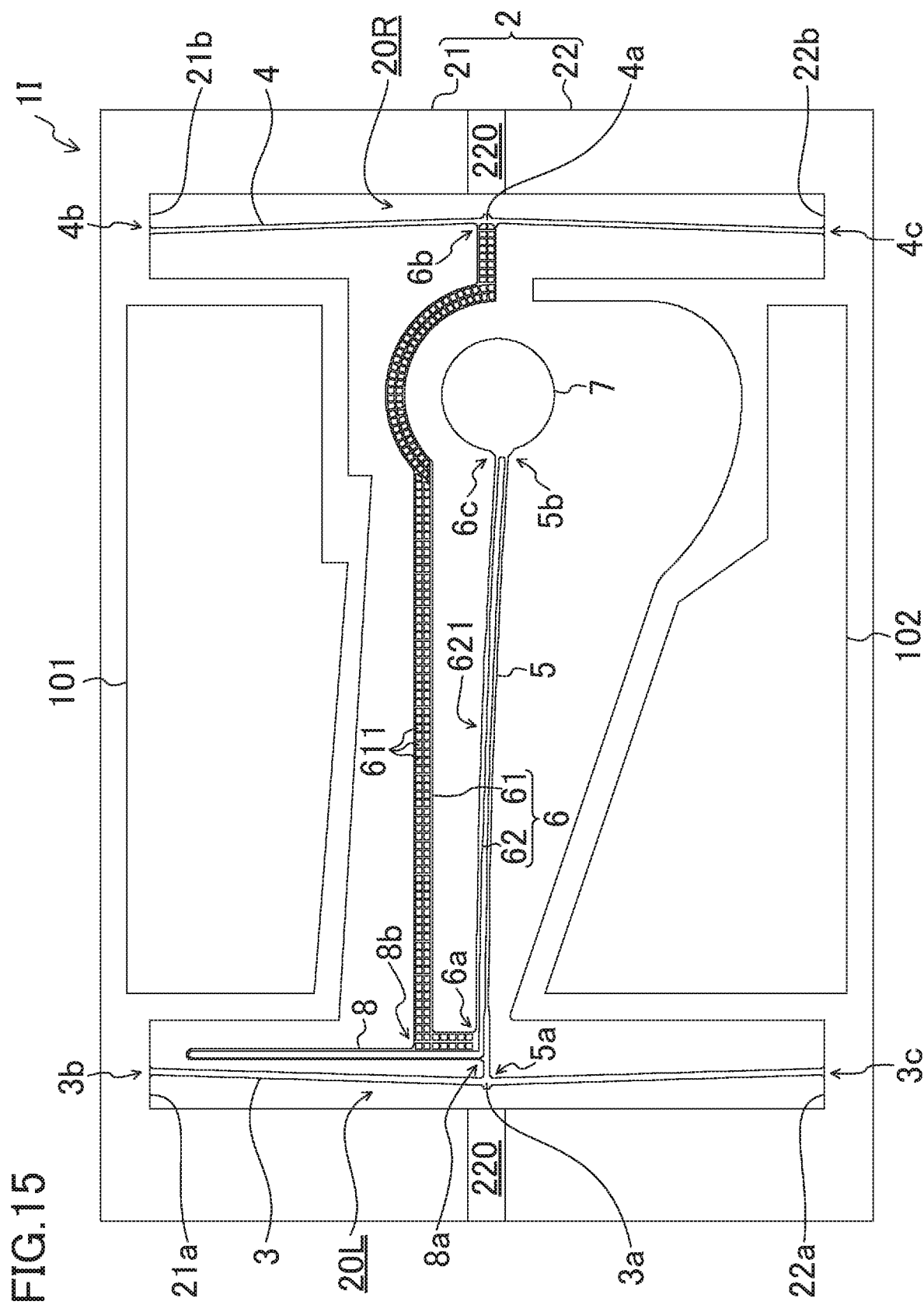
FIG. 15 is a plan view of a shutter device according to a ninth variation.

FIG. 15 illustrates a plan view of a shutter device 1I according to a ninth variation. The shutter device 1I is configured such that the first beam 5 and the second member 62 of the second beam 6 are formed in slightly-curved shapes in the shutter device 1F of FIG. 12. More specifically, in an initial state in which the drive target member 7 is not driven by the first actuator 3 and the second actuator 4, the first beam 5 and the second member 62 of the second beam 6 arranged in parallel are formed in advance in the slightly-curved shapes with different curvatures. In addition, the second member 62 may be in a linear shape, and the first beam 5 may be in the slightly-curved shape. In a case where the curvature of the second member 62 is X and the curvature of the first beam 5 is Y, when X>Y is satisfied, the first beam 5 is deformed in advance of the second member 62 upon driving of the first actuator 3 and the second actuator 4. Thus, the drive target member 7 can be more greatly driven, and the drive force necessary for driving of the drive target member 7 can be decreased.

In the shutter device 1I, when the first actuator 3 and the second actuator 4 are driven, the first beam 5 and the second member 62 of the second beam 6 are greatly curved or bent with the different curvatures, thereby pushing the drive target member 7 diagonally to the lower left side on the XY plane. Thus, the first beam 5 and the second member 62 of the second beam 6 are, in advance, formed slightly curved in the direction of driving the drive target member 7. With this configuration, when the first actuator 3 and the second actuator 4 are driven, the first beam 5 and the second beam 6 are easily curved or bent in predetermined directions.

<<Tenth Variation>>

Figure 16:
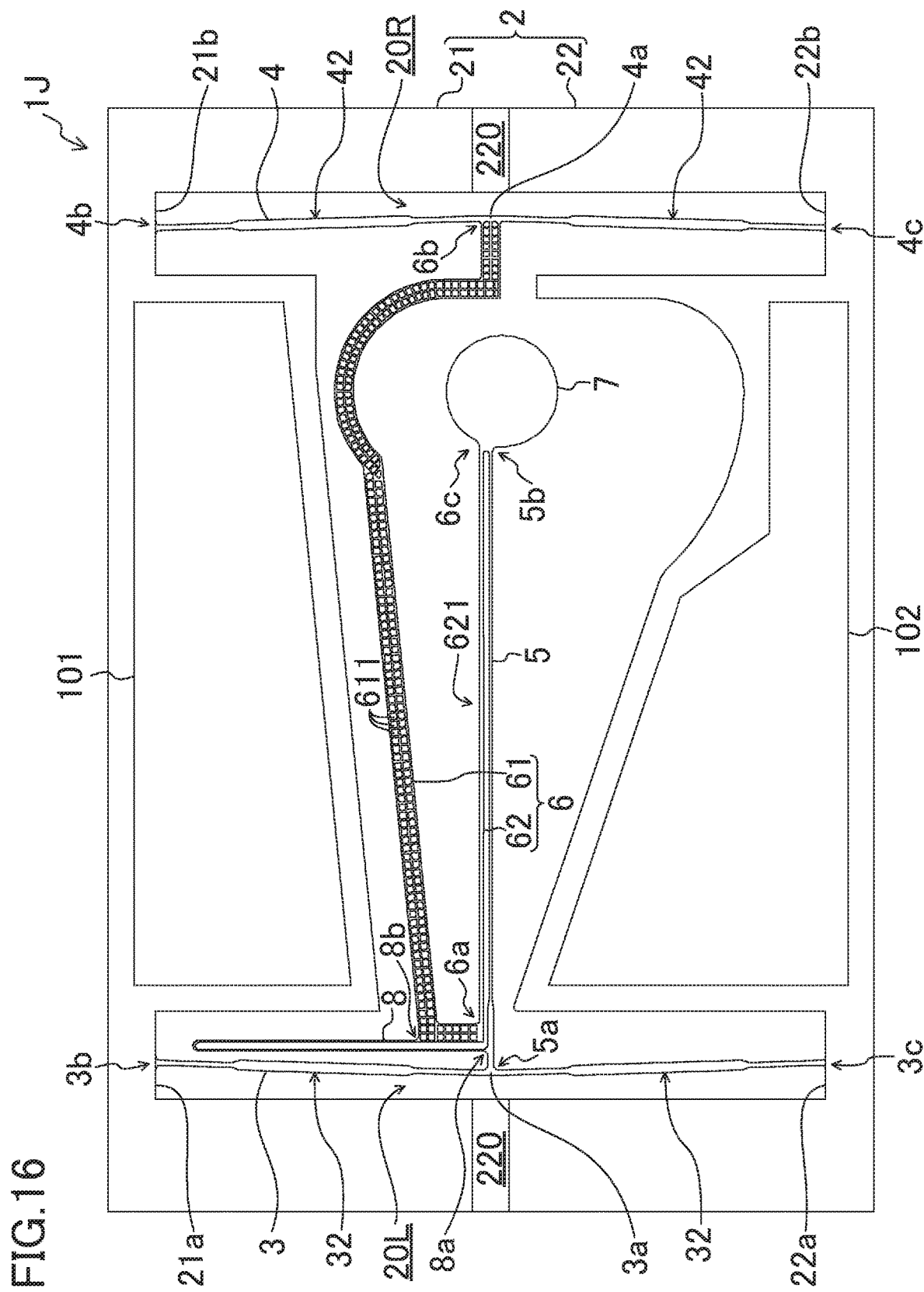
FIG. 16 is a plan view of a shutter device according to a tenth variation.

FIG. 16 illustrates a plan view of a shutter device 1J according to a tenth variation. As compared to the shutter device 1H of FIG. 14, the first member 61 of the second beam 6 is, in the shutter device 1J, formed slightly diagonally to the second member 62 such that the spacing between the first member 61 and the second member 62 of the second beam 6 is gradually narrowed toward the end portion 6a. As in the shutter device 14H, even when the first member 61 of the second beam 6 is slightly inclined, the second beam 6 can transmit the drive force of the second actuator 4 to the drive target member 7. Moreover, unlike the shutter device 1H of FIG. 14, the first actuator 3 and the second actuator 4 are formed flat without protrusions at the intermediate portion 3a and the intermediate portion 4a.

At the center portion between the intermediate portion 3a and the first end portion 3b and the center portion between the intermediate portion 3a and the second end portion 3c at the first actuator 3, e.g., the highly-elastic regions 32 formed slightly wide are provided for increasing the elasticity in the substrate surface direction than those of other regions of the first actuator 3. Similarly, at the center portion between the intermediate portion 4a and the first end portion 4b and the center portion between the intermediate portion 4a and the second end portion 4c at the second actuator 4, e.g., the highly-elastic regions 42 formed slightly wide are provided for increasing the elasticity in the substrate surface direction than those of other regions of the second actuator 4.

As described above, the center portion between the intermediate portion 3a and the first end portion 3b of the first actuator 3, the center portion between the intermediate portion 3a and the second end portion 3c of the first actuator 3, the center portion between the intermediate portion 4a and the first end portion 4b of the second actuator 4, and the center portion between the intermediate portion 4a and the second end portion 4c of the second actuator 4 are formed wide, and therefore, a decrease in the drive amounts of the intermediate portion 3a of the first actuator 3 and the intermediate portion 4a of the second actuator 4 due to deformation of the center portions where deformation easily occurs can be suppressed.

<<Eleventh Variation>>

Figure 17:
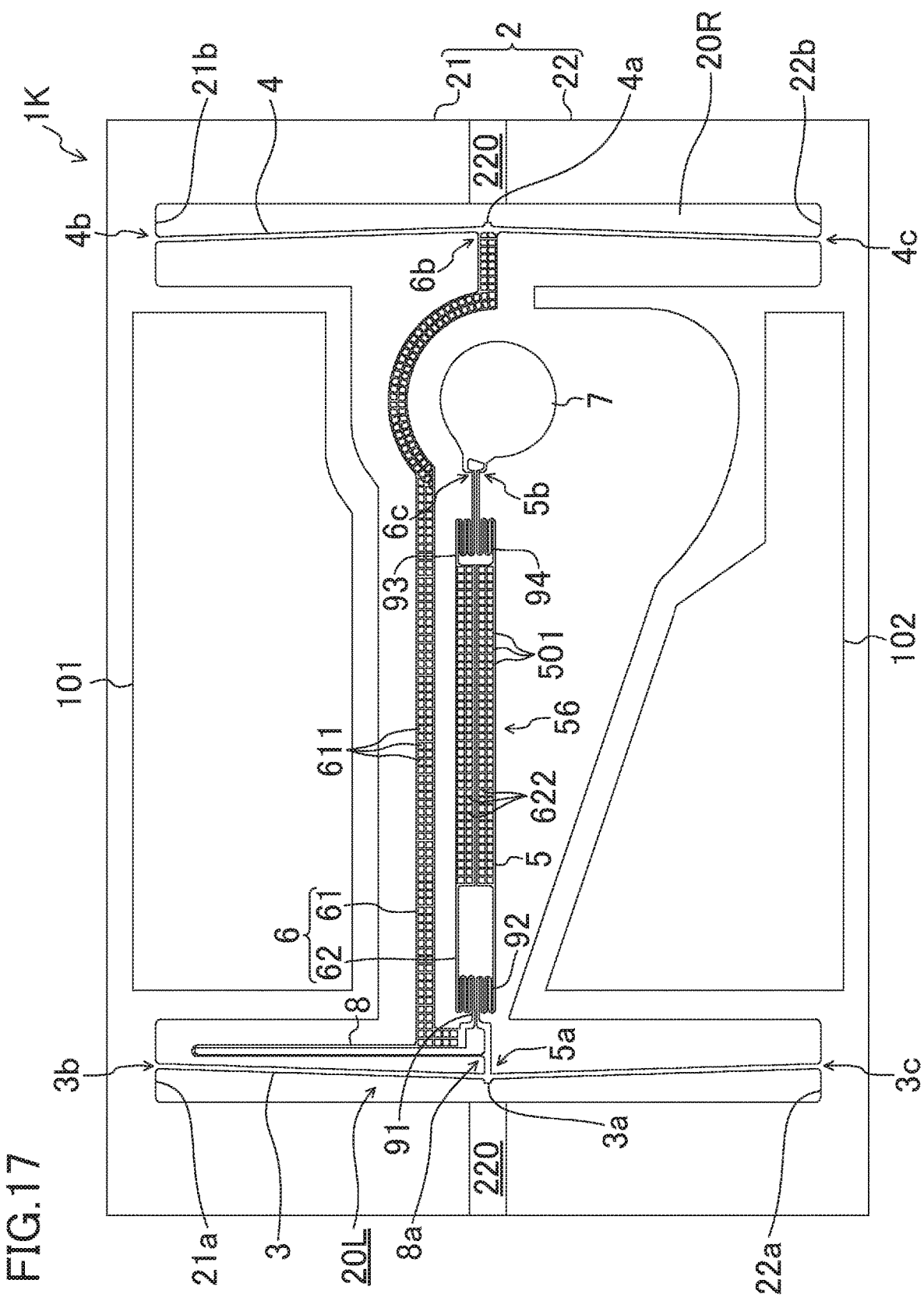
FIG. 17 is a plan view of a shutter device according to an eleventh variation.

FIG. 17 illustrates a plan view of a shutter device 1K according to an eleventh variation. As in the shutter device 1I of FIG. 15, the first beam 5 coupled to the intermediate portion 3a of the first actuator 3 at the first end portion 5a is coupled to the drive target member 7 at the second end portion 5b. Moreover, the second beam 6 coupled to the intermediate portion 4a of the second actuator 4 at the third end portion 6b is coupled to the drive target member 7 at the fourth end portion 6c. The second beam 6 has the first member 61 and the second member 62, and the first member 61 extends to the left side of the third end portion 6b in the X-direction while bypassing the upper side of the drive target member 7 in the Y-direction. Moreover, the first member 61 has the lightening portions (holes) 611. The second member 62 of the second beam 6 extends to the right side in the X-direction from a coupling portion to the first member 61. Further, the first beam 5 and the first member 61 of the second beam are coupled by the coupling member 8 in the vicinity of the first end portion 5a of the first beam 5. First, a difference from the shutter device 1I illustrated in FIG. 15 is that hinges 91 to 94 are provided at the first beam 5 and the second beam 6. Specifically, the hinge 91 is provided on the base end side of the second member 62 of the second beam 6, and the first member 61 and the second member 62 of the second beam 6 are coupled to each other. The hinge 92 is provided on the base end side of the first beam 5 at the parallel arrangement portion 56. Moreover, the hinge 93 is provided on the tip end side of the second beam 6, and the hinge 94 is provided on the tip end side of the first beam 5. That is, at the parallel arrangement portion 56, the hinges 91 to 94 are provided on both end sides of each beam. The elastic modulus of each of the hinges 91 to 94 is lower than that of the first beam 5 or the second member 62 of the second beam 6. Moreover, at the parallel arrangement portion 56, lightening portions (holes) 501 are formed at part of the first beam 5 at an intermediate portion between the hinge 92 and the hinge 94, and lightening portions (holes) 622 are formed at part of the second member 62 of the second beam 6 at an intermediate portion between the hinge 91 and the hinge 93.

Since the hinges 91 to 94 are provided as described above, each beam is less deformed at the parallel arrangement portion 56, and each of the hinges 91 to 94 is deformed. Thus, the deformation amount of the first beam 5 itself or the second member 62 itself of the second beam 6 is reduced, and therefore, the drive target member 7 can be pushed/pulled from the same side with these beams holding a substantially parallel relationship, and the drive amount of the drive target member 7 is not reduced. In particular, a longer length of the first beam 5 or the second member 62 of the second beam 6 results in lower stiffness and more easy deformation. Thus, an effect provided by the hinges 91 to 94 is increased. Moreover, according to this configuration, the drive amount of the drive target member 7 can be maintained while a great decrease in the resonance frequency can be suppressed. Thus, the shutter device 1K can be easily designed. Note that the lengths, shapes, etc. of the hinges 91 to 94 are not specifically limited to the configuration illustrated in FIG. 17, and as necessary, are determined according to the design specifications etc. of the shutter device 1K. Moreover, the lightening portions (holes) 501 and the lightening portions (holes) 622 are provided as a radiation structure at the first beam 5 and the second member 62 of the second beam 6. Thus, heat transmitted from the first actuator 3 and the second actuator 4 to the first beam 5 and the second beam can be radiated by the radiation structure such that much heat is not transmitted to the drive target member 7. Further, the masses of the first beam 5 and the second beam can be reduced, and therefore, the resonance frequency can be increased. In addition, at the parallel arrangement portion 56, the portion provided with the lightening portions (holes) 501 and the lightening portions (holes) 622 is formed wide to have a higher elastic modulus than those of other portions including the hinges 91 to 94. Thus, the effect of preventing deformation of the first beam 5 and the second member 62 of the second beam 6 is increased.

<<Twelfth Variation>>

Figure 18A:
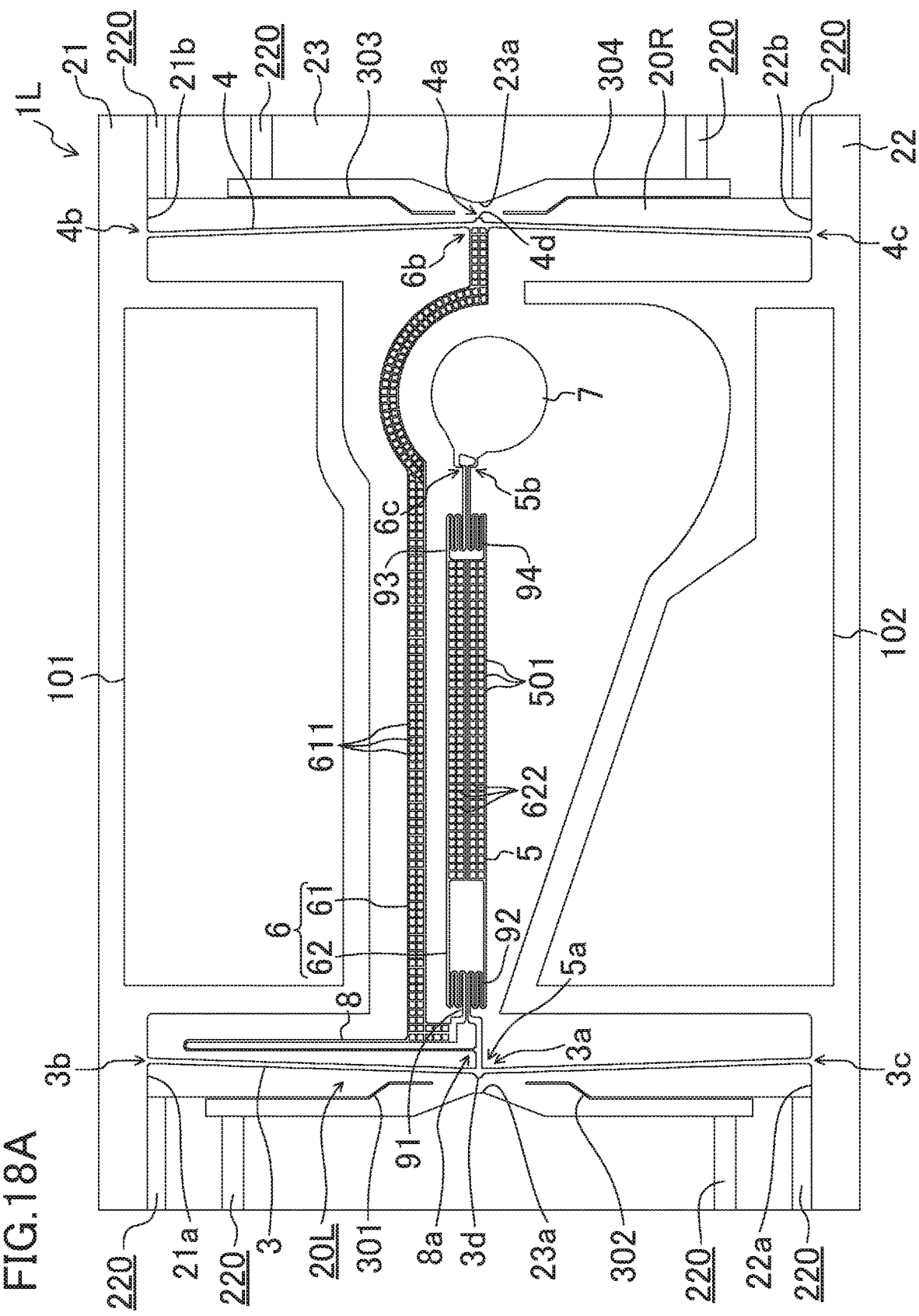
FIG. 18A is a plan view of a shutter device according to a twelfth variation.

FIGS. 18A and 18B illustrate plan views of a shutter device 1L according to a twelfth variation. FIG. 18A illustrates the shutter device 1L before driving, and FIG. 18B illustrates the shutter device 1L upon driving. As compared to the shutter device 1I of FIG. 15, cantilevers 301, 302 are provided in the opening 20L among the first and second base members 21, 22 and the first actuator 3, and cantilevers 303, 304 are provided in the opening 20R among the first and second base members 21, 22 and the second actuator 4. The cantilevers 301 to 304 are each provided to extend from the first base member 21 and the second base member 22 toward the intermediate portion 3a of the first actuator 3 connected to the first beam 5 and the intermediate portion 4a of the second actuator 4 connected to the first member 61 of the second beam 6. Moreover, the cantilevers 301 to 304 exhibit such flexibility that the cantilevers 301 to 304 are displaceable within a predetermined area about coupling portions to the first base member 21 and the second base member 22 as the points of support. Further, the cantilevers 301, 302 are provided within the drive area of the first actuator 3, and the cantilevers 303, 304 are provided within the drive area of the second actuator 4. Note that although not shown in the figure, the cantilevers 301 to 304 are, at the manufacturing steps illustrated in FIG. 6, integrally formed with the fixing portion 2, the first actuator 3, the second actuator 4, the first beam 5, and the second beam 6 by etching of the device layer. In addition, as illustrated in FIGS. 18A and 18B, a contact portion 3d whose left tip end in the X-direction is a flat surface is provided on the fixing portion 2 side at the intermediate portion 3a of the first actuator 3, and a contact portion 23a whose tip end is a flat surface is provided at a third base member 23 of the fixing portion 2 facing the contact portion 3d. The tip end of the contact portion 3d and the tip end of the contact portion 23a have the substantially same width. Note that as illustrated in FIGS. 18A and 18B, a contact portion 4d is, as in the intermediate portion 3a of the first actuator 3, is provided on the right side in the X-direction at the intermediate portion 4a of the second actuator 4, and the contact portion 23a is provided at the third base member 23 facing the contact portion 4d. The tip end of the contact portion 3d and the tip end of the contact portion 23a do not necessarily have the same width, and may have different widths. Further, the sizes of the contact portion 3d and the contact portion 23a are not limited to those of FIGS. 18A and 18B, and may be greater than these sizes. In addition, the first silicon layer 210 is removed between the first base member 21 and the third base member 23 and between the second base member 22 and the third base member 23. With this configuration, the contact portions 23a and the cantilevers 301 to 304 are electrically insulated from each other, and formation of a bypass for unnecessary current upon contact of the first actuator 3 or the second actuator 4 with the contact portion 23a or the cantilevers 301 to 304 can be prevented.

As illustrated in FIG. 18B, when the first actuator 3 is driven by power distribution, the first actuator 3 fixed to the fixing portion 2 at both end portions 3b, 3c is curved or bent to the left side in the X-direction illustrated in FIG. 1. In this state, the cantilevers 301, 302 come into contact with the first actuator 3, and therefore, displacement of the first actuator 3 is reduced. Moreover, when the first actuator 3 contacts the cantilevers 301, 302, the cantilevers 301, 302 exhibiting the flexibility is displaced within the predetermined area toward the left side in the X-direction, and reduces impact upon contact of the first actuator 3. With this configuration, displacement of the first actuator 3 is restricted by the cantilevers 301, 302 without damage etc. In a case where the first actuator 3 is further displaced toward the fixing portion 2 side after the first actuator 3 has contacted the cantilevers 301, 302, the contact portion 3d provided at the first actuator 3 comes into contact with the contact portion 23a provided at the fixing portion 2, and therefore, further displacement of the first actuator 3 can be restricted. Since the contact portion 3d and the contact portion 23a contact each other at the flat surfaces, displacement of the first actuator 3 can be restricted, and damage of the first actuator 3 can be reliably prevented. Further, by contact between the contact portion 3d and the contact portion 23a, heat generated at the first actuator 3 is directly radiated to the third base member 23, and therefore, an increase in the temperature of the first actuator 3 can be suppressed. An increase in the temperature of the intermediate portion 3a is great upon driving of the first actuator 3. However, the contact portion 3d and the contact portion 23a are provided so that variation in the temperature in the first actuator 3 can be reduced and damage and breakage due to heat or stress at the first actuator 3 can be reduced. Moreover, propagation of heat generated at the first actuator 3 to the drive target member 7 through the first beam 5 or the second member 62 of the second beam can be reduced. Thus, silicon diffusion in the metal film 71 can be prevented in the drive target member 7, and a change in the optical properties such as unavailability of blocking of light can be prevented, for example. Further, the cantilevers 301, 302 are provided so that heat generated at the first actuator 3 can be also radiated to the first base member 21 and the second base member 22. Thus, an increase in the temperature of the first actuator 3 can be suppressed. Note that as in the description above, the contact portions 4d, 23a and the cantilevers 303, 304 are provided so that displacement of the second actuator 4 can be also restricted and a temperature increase can be also suppressed, for example.

<<Thirteenth Variation>>

Figure 19A:
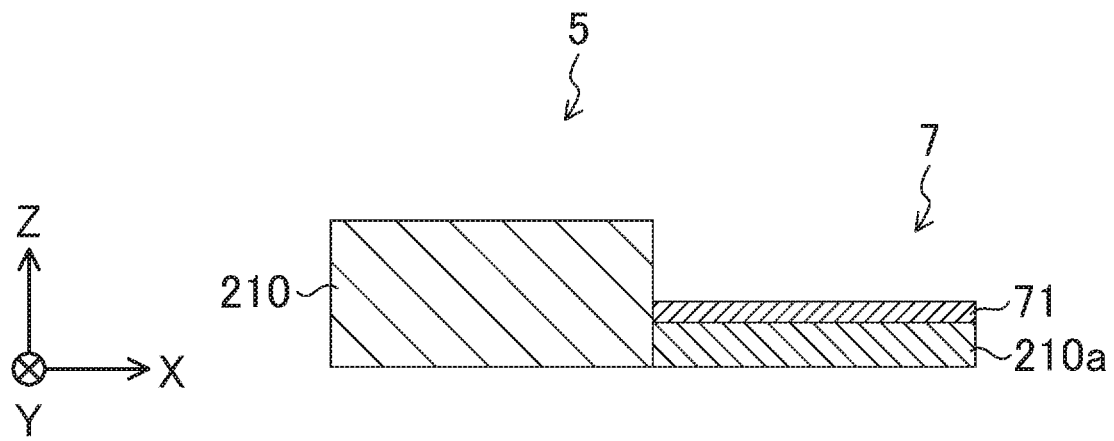
FIG. 19A is a sectional view of a drive target member according to a thirteenth variation.
Figure 19B:
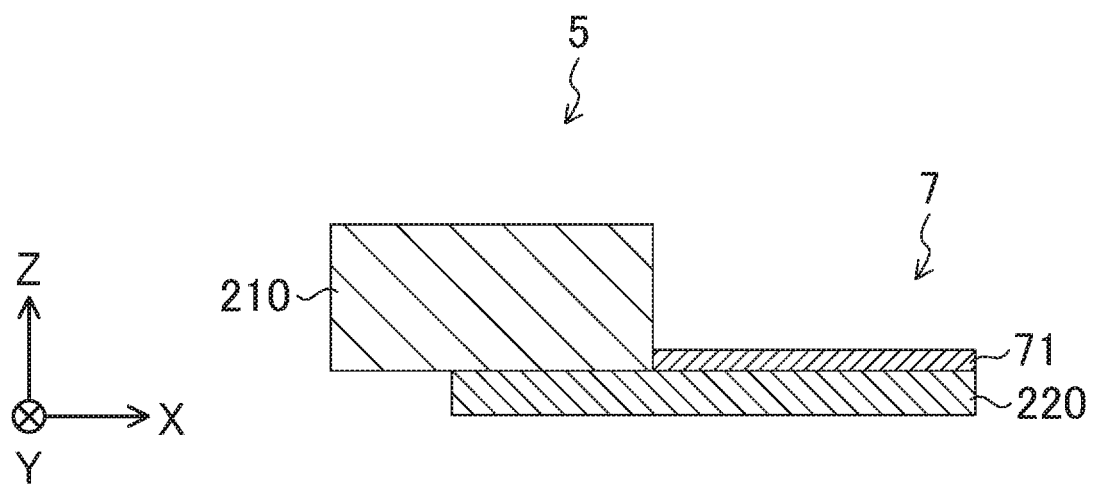
FIG. 19B is another sectional view of the drive target member according to the thirteenth variation.

FIGS. 19A and 19B illustrate plan views of the drive target member according to a thirteenth variation, and each correspond to the sectional view of FIG. 4. As described with reference to FIGS. 2, 4, and 6, the drive target member 7 is, in the above-described embodiment, formed thinner than other members forming the above-described displacement increasing mechanism. Thus, the mass of the drive target member 7 is decreased, and the resonance frequency is increased. In configurations illustrated in FIGS. 19A and 19B, the drive target member 7 is formed thinner than other members forming the above-described displacement increasing mechanism, or instead of such a configuration, the material of the drive target member 7 is different from those of other members. In this manner, the resonance frequency is increased. For example, in the configuration illustrated in FIG. 19A, the drive target member 7 has a multilayer structure of a porous silicon layer 210a and the metal film 71. The porous silicon layer 210a has a lower density than that of the first silicon layer 210, and therefore, the mass of the drive target member 7 can be decreased as compared to a case where the first silicon layer 210 forms the drive target member 7 as illustrated in FIG. 4. Moreover, in the configuration illustrated in FIG. 19B, the drive target member 7 has a multilayer structure of the oxide film layer 220 and the metal film 71. The oxide film layer 220 has also a lower density than that of the first silicon layer 210, and therefore, the mass of the drive target member 7 can be decreased as compared to a case where the first silicon layer 210 forms the drive target member 7 as illustrated in FIG. 4. Note that for ensuring coupling strength among the drive target member 7 and the first and second beams 5, 6, part of the oxide film layer 220 remains below the first and second beams 5, 6.

Note that in the configuration illustrated in FIG. 19A, the porous silicon layer 210a is, before etching of the device layer, formed in advance by, e.g., an anode oxidation method in a region where the drive target member 7 is expected to be formed. In a state in which the porous silicon layer 210a is formed, the displacement increasing mechanism is integrally formed. Although not shown in the figure, part of the oxide film layer 220 remains below the first and second beams 5, 6 for ensuring the coupling strength among the drive target member 7 and the first and second beams 5, 6 in the configuration illustrated in FIG. 19B, but instead, the oxide film layer 220 may remain and the first silicon layer 210 may thinly remain on the surface of the oxide film layer 220. Moreover, both of the porous silicon layer 210a and the oxide film layer 220 have a smaller coefficient of heat conduction than that of the first silicon layer 210, and therefore, the effect of reducing transfer of heat generated at the first actuator 3 and the second actuator 4 to the drive target member 7 can be improved.

Other Embodiments

As described above, the above-described embodiment has been described as an example of the technique disclosed in the present application. However, the technique of the present disclosure is not limited to this technique, and is also applicable to embodiments to which changes, replacements, additions, omissions, etc. are made as necessary. Moreover, the components described above in the embodiment may be combined to form a new embodiment. Further, the components described in the detailed description with reference to the attached drawings may include not only components essential for solving the problems, but also components not essential for solving the problems and provided for illustrating the above-described technique by an example. Thus, description of the non-essential components in the detailed description with reference to the attached drawings should not be directly recognized that these non-essential components are essential.

The above-described embodiment may have the following configurations.

As long as it is configured such that the first beam 5 pulls the drive target member 7 from the second end portion 5b in the direction of extending the first beam 5 and the second beam 6 pushes the drive target member 7 from the fourth end portion 6c in the direction of extending the second beam 6 or it is configured such that such force acts in the opposite direction, the first actuator 3 and the second actuator 4 may have a structure different from above. For example, FIG. 20 illustrates a plan view of a shutter device 1M according to another embodiment of the present invention. In the shutter device 1M, the first base member 21 in the shutter device described so far is divided in half to form the third base member 23. The third base member 23 is electrically insulated from the first base member 21 and the second base member 22, and a third electrode 103 is formed on the upper surface of the third base member 23. The second actuator 4 is arranged at a boundary between the first base member 21 and the third base member 23. The second actuator 4 has a rod-shaped first member 43 extending downward in the Y-direction from the right end of the first base member 21 in the X-direction, and a second member 44 formed wider than the first member 43 and extending downward in the Y-direction from the left end of the third base member 23 in the X-direction. A first end portion 43a of the first member 43 is coupled to the first base member 21, a first end portion 44a of the second member 44 is coupled to the third base member 23, and a second end portion 43b of the first member 43 and a second end portion 44b of the second member 44 are coupled to each other. Moreover, the third end portion 6b of the second beam 6 is coupled to the second end portion 44b of the second member 44 of the second actuator 4. In the shutter device 1M having such a configuration, when voltage is applied to between the first electrode 101 and the third electrode 103, current flows in the first member 43 and the second member 44 of the second actuator 4, and these members are heated and thermally expanded. In this state, the first member 43 narrower than the wide second member 44 is more greatly thermally expanded. Thus, the second end portion 44b of the second member 44 is driven to the right side in the X-direction, the second actuator 4 is deformed to entirely curve or bend to the right side in the X-direction, and the second beam 6 is pushed to the right side in the X-direction. Meanwhile, voltage is also applied between the first electrode 101 and the second electrode 102, the first beam 5 is pulled to the left side in the X-direction as described above. As a result, the drive target member 7 is driven diagonally to the lower left side on the XY plane.

Even when such a change is added to the shutter device 1M, the drive forces of the first beam 5 and the second beam 6 driven by the first actuator 3 and the second actuator 4 are combined to drive the drive target member 7, and therefore, the drive target member 7 can be greatly displaced by slight displacement of the first actuator 3 and the second actuator 4.

Moreover, fins, recessed and raised portions, cutouts, a lightening structure, etc. may be provided at the radiation structure at the first beam 5 and the second member 62 of the second beam 6.

Figure 21:
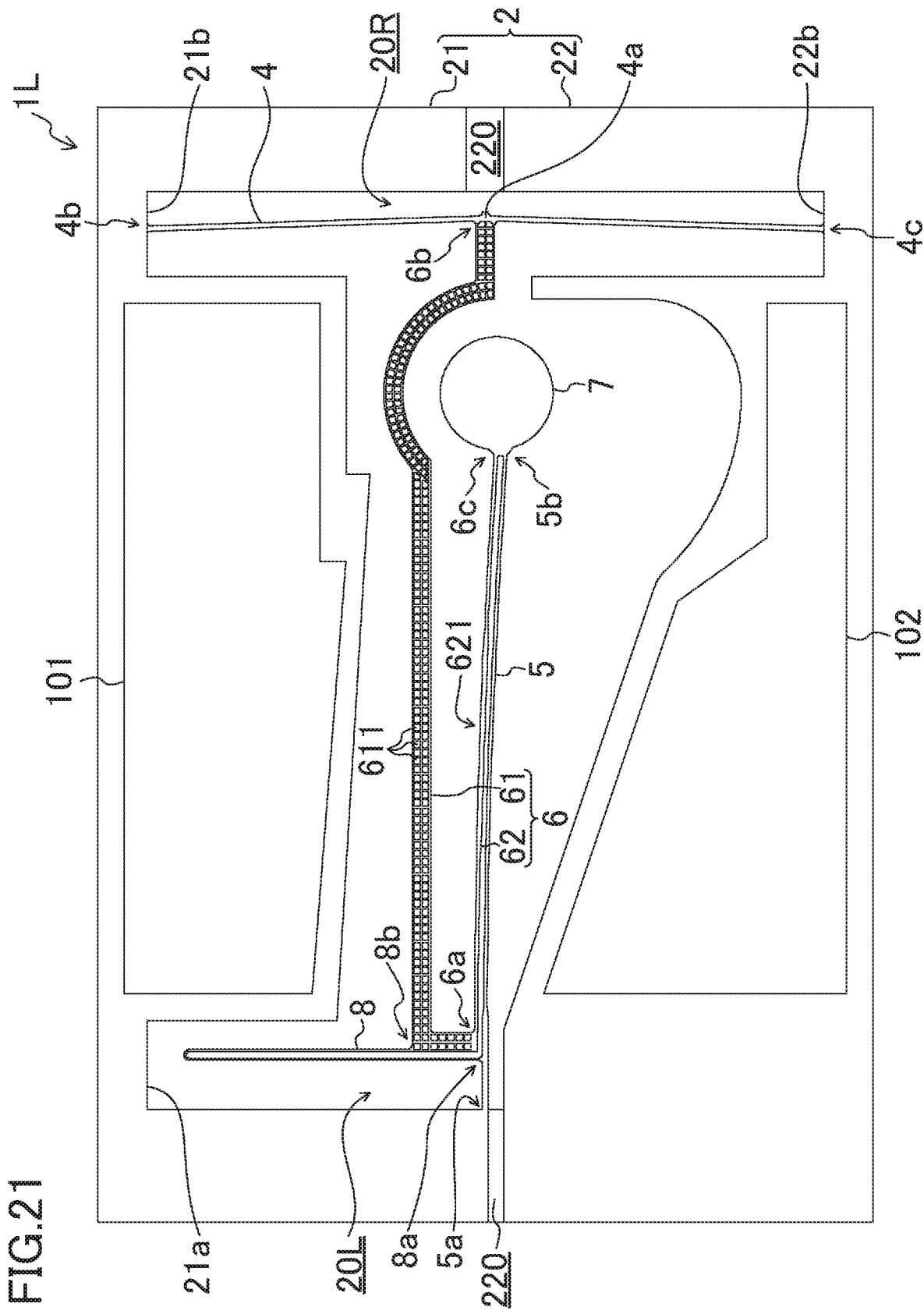
FIG. 21 is a plan view of a shutter device configured such that a first actuator is omitted.
Figure 22:
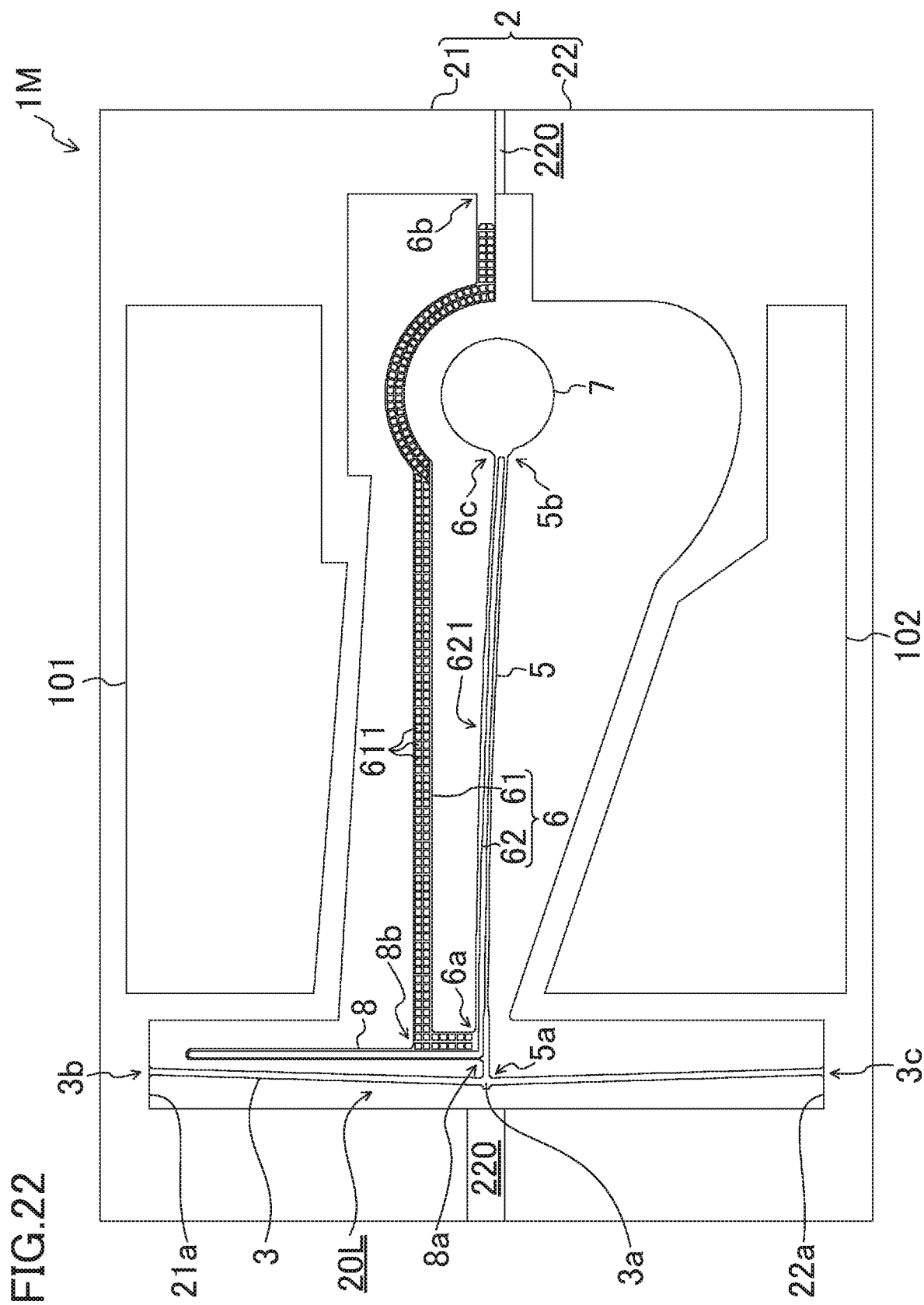
FIG. 22 is a plan view of a shutter device configured such that a second actuator is omitted.

Further, either one of the first actuator 3 or the second actuator 4 may be omitted. For example, FIG. 21 illustrates a plan view of a shutter device 1N configured in such a manner that the first actuator 3 is omitted from the shutter device 1I of FIG. 15. In the shutter device 1N, the first end portion 5a of the first beam 5 is coupled to the first base member 21. Note that the first end portion 5a of the first beam 5 may be coupled not to the first base member 21 but to the second base member 22. FIG. 22 illustrates a plan view of a shutter device 1O configured in such a manner that the second actuator 4 is omitted from the shutter device 1I of FIG. 15. In the shutter device 1O, the third end portion 6b of the second beam 6 is coupled to the first base member 21. Note that the third end portion 6b of the second beam 6 may be coupled not to the first base member 21 but to the second base member 22. Moreover, in the shutter device 1O, the second beam 6 is not directly coupled to a member generating heat, and radiation is not necessarily taken into consideration. Thus, the lightening portions 611 at the first member 61 are not necessarily formed.

Regarding the above-described embodiments, the following appendices will be further disclosed.

FIRST APPENDIX

A displacement increasing mechanism including:
a fixing portion;
a first actuator and a second actuator coupled to the fixing portion;
a first beam having a first end portion and a second end portion and coupled to the first actuator at the first end portion;
a second beam having a third end portion and a fourth end portion and coupled to the second actuator at the third end portion; and
a drive target member coupled to the second end portion of the first beam and the fourth end portion of the second beam,
in which the first beam and the second beam have a parallel arrangement portion at which the first beam and the second beam are arranged in parallel with each other, and the drive target member is coupled on a tip end side of the parallel arrangement portion,
the first actuator is driven to pull the first beam from a second end portion side in the direction of extending the first beam, and the second actuator is driven to push the second beam from a fourth end portion side in the direction of extending the second beam.

SECOND APPENDIX

The displacement increasing mechanism according to the first appendix, in which the third end portion is coupled to the fixing portion through the second actuator coupled to the fixing portion.

THIRD APPENDIX

The displacement increasing mechanism according to the first or second appendix, in which
the first beam and the second beam are coupled to the drive target member from the same direction.

FOURTH APPENDIX

The displacement increasing mechanism according to any one of the first to third appendices, in which
the first end portion and the third end portion are arranged facing each other,
the drive target member is arranged between the first end portion and the third end portion, and
the first beam or the second beam has a folded-back structure.

FIFTH APPENDIX

The displacement increasing mechanism according to any one of the first to fourth appendices, in which
a highly-elastic region is provided at part of the first beam or the second beam bendable while pushing the drive target member.

SIXTH APPENDIX

The displacement increasing mechanism according to any one of the first to fifth appendices, in which
the drive target member is formed thinner than the first beam and/or the second beam, and
a radiation portion is formed using a difference in a thickness between the drive target member and the first beam or the second beam.

SEVENTH APPENDIX

A displacement increasing mechanism including:
a substrate;
a fixing portion provided at the substrate;
a first actuator coupled to the fixing portion;
a first beam coupled to the first actuator on a base end side and extending in parallel with an upper surface of the substrate;
a second actuator provided at the fixing portion;
a second beam coupled to the second actuator on a base end side and extending in parallel with the upper surface of the substrate; and
a drive target member coupled to tip end sides of the first beam and the second beam,
in which the tip end side of the first beam is folded back and coupled to the tip end side of the second beam,
the first beam and the second beam have a parallel arrangement portion at which the first beam and the second beam are arranged in parallel with each other, and the first actuator pushes or pulls the drive target member through the first beam, and the second actuator causes force to act on the drive target member through the second beam in an opposite direction of the first actuator.

EIGHTH APPENDIX

A displacement increasing mechanism including:
a substrate;
a fixing portion provided at the substrate;
an actuator provided at the fixing portion;
a drive target member provided in a substrate plane;
an extending first beam coupled to the drive target member on a tip end side; and
a second beam extending in parallel with the first beam on a tip end side and coupled to the drive target member,
in which a base end side of the second beam is folded back, and
one of a base end side of the first beam or the base end side of the second beam is coupled to the actuator, and the other one of the base end side of the first beam or the base end side of the second beam is coupled to the fixing portion.

INDUSTRIAL APPLICABILITY

As described above, the technique disclosed herein is useful for the displacement increasing mechanism and the shutter device.

DESCRIPTION OF REFERENCE CHARACTERS 1, 1A to 1M Shutter Device
2 Fixing Portion
21 First Base Member
22 Second Base Member
23 Third Base Member
23a Contact Portion
3 First Actuator
3a Intermediate Portion
3b First End Portion
3c Second End Portion
3d Contact Portion
4 Second Actuator
4a Intermediate Portion
4b First End Portion
4c Second End Portion
4d Contact Portion
5 First Beam
56 Parallel Arrangement Portion
5a First End Portion
5b Second End Portion
6 Second Beam
6b Third End Portion
6c Fourth End Portion
611 Lightening Portion (Lightening Structure)
621 Highly-Elastic Region
7 Drive Target Member
72 Radiation Portion
8 Coupling Member
101 First Electrode
102 Second Electrode
210 First Silicon Layer
210a Porous Silicon Layer
220 Oxide Film Layer
230 Second Silicon Layer
91 To 94 Hinge
301 To 304 Cantilever (Flexible Member)

The invention claimed is:

1. A displacement increasing mechanism comprising:
a fixing portion;
a first actuator and a second actuator coupled to the fixing portion;
a first beam having a first end portion and a second end portion and coupled to the first actuator at the first end portion;
a second beam having a third end portion and a fourth end portion and coupled to the second actuator at the third end portion; and
a drive target member coupled to the second end portion of the first beam and the fourth end portion of the second beam,
wherein the first beam and the second beam have a parallel arrangement portion at which the first beam and the second beam are arranged in parallel with each other, and the drive target member is coupled on a tip end side of the parallel arrangement portion,
the first actuator is driven to pull the first beam from a second end portion side in a direction of extending the first beam, and
the second actuator is driven to push the second beam from a fourth end portion side in a direction of extending the second beam.

2. The displacement increasing mechanism according to claim 1, wherein
the first beam and the second beam are coupled to the drive target member from an same direction.

3. The displacement increasing mechanism according to claim 1, wherein
the first actuator and the second actuator are arranged facing each other.

4. The displacement increasing mechanism according to claim 3, wherein
the drive target member is arranged between the first actuator and the second actuator, and
the first beam or the second beam has a folded-back structure.

5. The displacement increasing mechanism according to claim 1, wherein
the first beam and the second beam are coupled to each other through a coupling member.

6. The displacement increasing mechanism according to claim 1, wherein
a lightening structure is formed at part of the first beam or the second beam.

7. The displacement increasing mechanism according to claim 1, wherein
a thickness of the drive target member is less than that of the first beam or the second beam.

8. The displacement increasing mechanism according to claim 7, wherein
a radiation portion is, at at least one of the first beam or the second beam, formed using a difference in a thickness from the drive target member.

9. The displacement increasing mechanism according to claim 1, wherein
each of the first beam and the second beam is formed in a shape slightly curved in a direction of driving the drive target member.

10. The displacement increasing mechanism according to claim 1, wherein
the parallel arrangement portion at at least either one of the first beam or the second beam partially has a portion with a higher elastic modulus than those of other portions of the parallel arrangement portion.

11. The displacement increasing mechanism according to claim 1, wherein
a buffer member is provided at the fixing portion within a drive area of at least either one of the first actuator or the second actuator.

12. The displacement increasing mechanism according to claim 1, wherein
a flexible member extending from the fixing portion is provided within a drive area of at least either one of the first actuator or the second actuator.

13. The displacement increasing mechanism according to claim 12, wherein
at at least either one of an intermediate portion of the first actuator or an intermediate portion of the second actuator,
a contact portion whose tip end is a flat surface is provided at a portion facing the fixing portion, and
another contact portion whose tip end is a flat surface is provided at a portion of the fixing portion facing the intermediate portion.

14. The displacement increasing mechanism according to claim 1, wherein
both end sides of the parallel arrangement portion of the first beam and the second beam have a lower elastic modulus than those of other portions of the parallel arrangement portion.

15. The displacement increasing mechanism according to claim 1, wherein
hinges are provided on both end sides of the parallel arrangement portion of the first beam and the second beam.

16. A displacement increasing mechanism comprising:
a substrate;
a fixing portion provided at the substrate;
a first actuator coupled to the fixing portion;
a first beam coupled to the first actuator on a base end side and extending in parallel with an upper surface of the substrate;
a second actuator provided at the fixing portion;
a second beam coupled to the second actuator on a base end side and extending in parallel with the upper surface of the substrate; and
a drive target member coupled to tip end sides of the first beam and the second beam,
wherein the tip end side of the first beam is folded back and coupled to the tip end side of the second beam,
the first beam and the second beam have a parallel arrangement portion at which the first beam and the second beam are arranged in parallel with each other, and
the first actuator pushes or pulls the drive target member through the first beam, and the second actuator causes force to act on the drive target member through the second beam in an opposite direction of the first actuator.

17. The displacement increasing mechanism according to claim 16, wherein
the second beam is further folded back and coupled to the second actuator on the base end side.

18. A displacement increasing mechanism comprising:
a substrate;
a fixing portion provided at the substrate;
an actuator coupled to the fixing portion;
a drive target member provided at the substrate;
a first beam coupled to the drive target member on a tip end side; and a second beam extending in parallel with the first beam on a tip end side and coupled to the drive target member, wherein a base end side of the second beam is folded back, and one of a base end side of the first beam or the base end side of the second beam is coupled to the actuator, and the other one of the base end side of the first beam or the base end side of the second beam is coupled to the fixing portion.

19. The displacement increasing mechanism according to claim 18, wherein the actuator includes a first actuator and a second actuator, and the first beam is coupled to the first actuator, and the second beam is coupled to the second actuator.

20. A shutter device comprising:

the displacement increasing mechanism according to claim 1;

a first electrode arranged on the fixing portion of the displacement increasing mechanism and electrically connected to the first end portion of the first actuator and the first end portion of the second actuator of the displacement increasing mechanism; and a second electrode arranged on the fixing portion of the displacement increasing mechanism and electrically connected to the second end portion of the first actuator and the second end portion of the second actuator of the displacement increasing mechanism, wherein a light path is closed or opened by the drive target member of the displacement increasing mechanism.

* * * * *